US012765072B2

(12) United States Patent
Hung et al.

(10) Patent No.: US 12,765,072 B2
(45) Date of Patent: Oct. 13, 2026

(54) INTEGRATED CIRCUIT AND METHOD OF MANUFACTURING

(71) Applicant: TAIWAN SEMICONDUCTOR MANUFACTURING COMPANY, LTD., Hsinchu (TW)

(72) Inventors: Tao-Yi Hung, Hsinchu (TW); Jam-Wem Lee, Hsinchu (TW); Kuo-Ji Chen, Hsinchu (TW); Wun-Jie Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 658 days.

(21) Appl. No.: 18/188,937

(22) Filed: Mar. 23, 2023

(65) Prior Publication Data

US 2024/0222364 A1 Jul. 4, 2024

Related U.S. Application Data

(60) Provisional application No. 63/477,423, filed on Dec. 28, 2022.

(51) Int. Cl.

*H10D 89/60* (2025.01)
*H10D 84/01* (2025.01)
*H10D 84/03* (2025.01)
*H10W 20/41* (2026.01)

(52) U.S. Cl.

CPC ....... *H10D 89/811* (2025.01); *H10D 84/0149* (2025.01); *H10D 84/038* (2025.01); *H10W 20/427* (2026.01)

(58) Field of Classification Search

CPC ... H10D 89/921; H10D 89/813; H10D 89/931
See application file for complete search history.

(56) References Cited

U.S. PATENT DOCUMENTS

| | | | | |
|---|---|---|---|---|
| 2003/0207541 | A1 | 11/2003 | Tan | |
| 2013/0146981 | A1 | 6/2013 | Yang et al. | |
| 2017/0070225 | A1 | 3/2017 | Kim et al. | |
| 2021/0305252 | A1 | 9/2021 | Chiang et al. | |
| 2021/0305809 | A1 * | 9/2021 | Hung | H10D 89/817 |
| 2022/0037496 | A1 | 2/2022 | Chen et al. | |

FOREIGN PATENT DOCUMENTS

| | | |
|---|---|---|
| CN | 205508819 | 8/2016 |
| KR | 10-2018-0051592 | 5/2018 |
| KR | 10-2021-0122666 | 10/2021 |
| TW | 201541555 | 11/2015 |

* cited by examiner

*Primary Examiner* — Fernando L Toledo
*Assistant Examiner* — Adam S Bowen
(74) *Attorney, Agent, or Firm* — Hauptman Ham, LLP

(57) ABSTRACT

An integrated circuit (IC) device includes an antenna effect protection device, and a to-be-protected device. A first source/drain of the antenna effect protection device is electrically coupled to a first conductor configured to carry a reference voltage. A second source/drain of the antenna effect protection device is electrically coupled by a second conductor to a gate of the to-be-protected device. The antenna effect protection device is a bulk-less device.

20 Claims, 21 Drawing Sheets

INTEGRATED CIRCUIT AND METHOD OF MANUFACTURING

RELATED APPLICATION(S)

This application claims the benefit of U.S. Provisional Application No. 63/477,423, filed Dec. 28, 2022, which is herein incorporated by reference in its entirety.

BACKGROUND

The recent trend in miniaturizing integrated circuit (IC) devices has resulted in smaller semiconductor devices which consume less power, yet provide more functionality at higher speeds. The miniaturization process has also increased the semiconductor devices' susceptibility to damages due to various factors, such as thinner gate dielectric thicknesses, lowered dielectric breakdown voltages, or the like. The antenna effect is one of the causes of circuit damages in IC devices, and is a consideration in semiconductor advanced technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
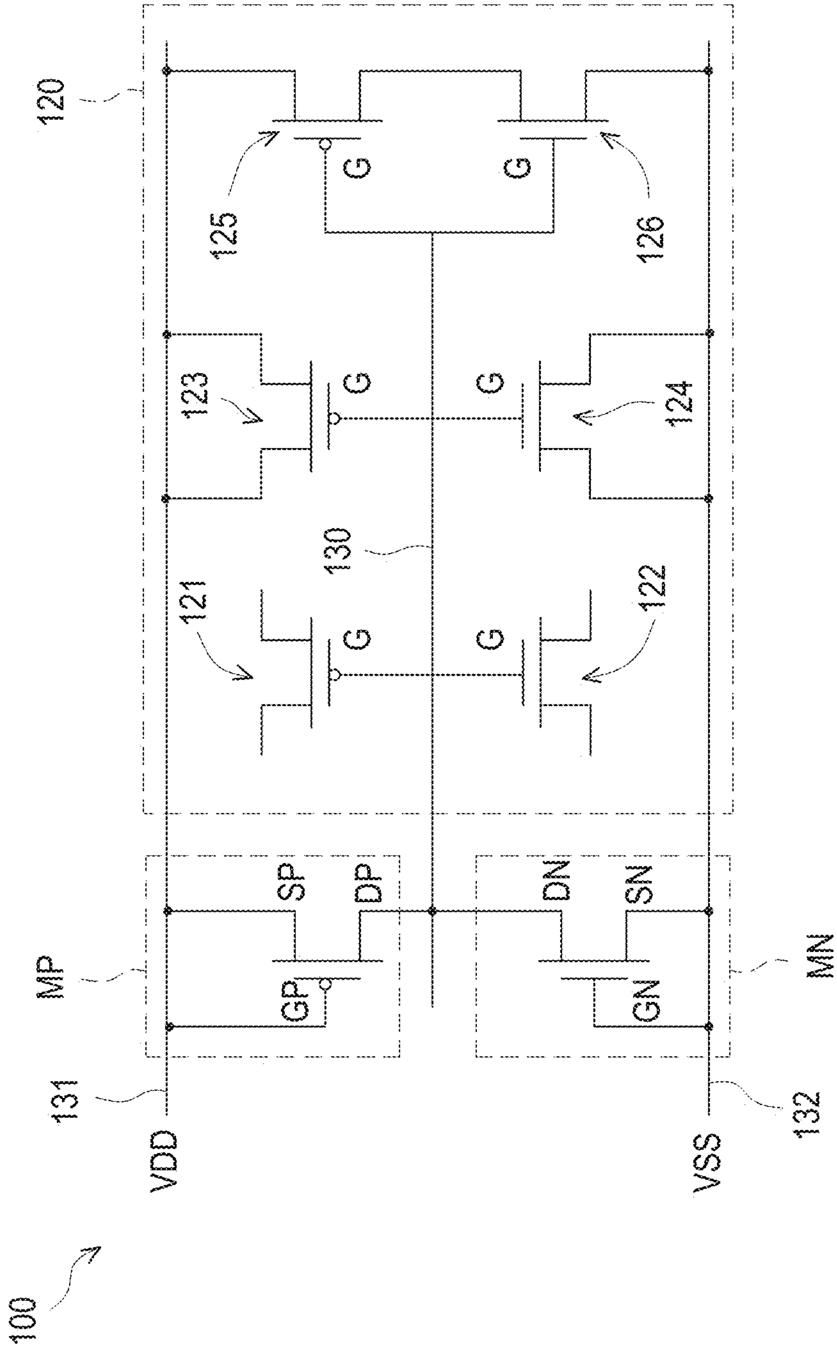
FIG. 1 is a schematic circuit diagram of an IC device, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Source/drain(s) may refer to a source or a drain, individually or collectively dependent upon the context.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In a manufacturing process of an IC device, transistors are formed over a substrate. Each of the transistors comprises a gate electrode, and a gate dielectric between the gate electrode and the substrate. The gate dielectric is an oxide or another gate dielectric material. In manufacturing operations subsequent to the formation of transistors, various dielectric and metal layers are deposited and patterned to obtain conductive vias and/or patterns electrically coupled to the gate electrodes of the transistors. Deposition and/or patterning operations often include plasma operations, such as plasma etching operations, plasma deposition operations, or the like. In plasma operations, it is possible that a sufficient amount of electrical charge is accumulated on a conductor (e.g., an interconnect) coupled to a gate electrode, and causes breakdown of the underlying gate dielectric and damage to the corresponding transistor. This issue is referred to as "plasma induced gate oxide damage" (PID), or "antenna effect," which potentially causes yield and/or reliability concerns during a semiconductor manufacturing process. Antenna effect protection circuits and/or devices are included in IC devices to protect other transistors and/or circuits from being damaged due to the antenna effect.

In some embodiments, an antenna effect protection device comprises a first source/drain electrically coupled to a first conductor, and a second source/drain electrically coupled by a second conductor to a gate of a device to be protected from the antenna effect. In some embodiments, a device to be protected from the antenna effect is a functional device or another antenna effect protection device. In at least one embodiment, the antenna effect protection device is a bulk-less device. An example of a bulk-less device is a semiconductor device formed or fabricated over an insulation layer. A further example of a bulk-less device is a semiconductor device formed or fabricated over a bulk of a semiconductor substrate, and then the bulk of the semiconductor substrate is removed during further processing and replaced with an insulation layer. Other bulk-less device configurations and/or manufacturing processes are within the scopes of various embodiments.

In some embodiments, the antenna effect protection device is configured to discharge electric charges on the second conductor, which electrically couples the second source/drain of the antenna effect protection device and the gate of the device to be protected, to the first conductor. As a result, the gate dielectric of the to-be-protected device is protected from potential damages associated with electric charges on the second conductor. In at least one embodiment, the antenna effect protection device, being a bulk-less device, is configured to discharge the electric charges by a leakage current or a channel current in the antenna effect protection device. This is different from other approaches which rely on an intrinsic body diode in a device, such as an antenna diode, to provide protection against the antenna effect. An intrinsic body diode does not exist in a bulk-less device, and therefore, the other approaches may not be usable in semiconductor advanced technology with bulk-less manufacturing processes. In contrast, one or more embodiments provide antenna effect protection devices and circuits which are configured to provide antenna effect protection in bulk-less manufacturing processes. In at least one embodiment, an antenna effect protection device or circuit in one power domain of an IC device is configured to provide antenna effect protection for one or more devices in another power domain of the IC device.

FIG. 1 is a schematic circuit diagram of an IC device 100, in accordance with some embodiments.

The IC device 100 comprises at least one antenna effect protection device and at least one device to be protected by the antenna effect protection device from the antenna effect. In the example configuration in FIG. 1, the IC device 100 comprises a pair of antenna effect protection devices MP, MN, and a plurality of to-be-protected devices commonly referred to as to-be-protected devices 120. The described numbers of antenna effect protection devices and to-be-protected devices in the IC device 100 are examples. Any other numbers of antenna effect protection devices and/or to-be-protected devices in the IC device 100 are within the scopes of various embodiments. For example, in one or more embodiments, one of the antenna effect protection devices MP, MN is sufficient to provide antenna effect protection (also referred to herein as “antenna function” or “antenna usage”) for multiple to-be-protected devices 120, and the other of the antenna effect protection devices MP, MN is omitted.

The to-be-protected devices 120 include devices 121-126 of one or more functional circuits. For simplicity, the devices 121-126 are referred to herein as functional devices. A functional circuit is configured to perform an intended function of the IC device 100, e.g., data processing, data storage, input/output (I/O), or the like. Examples of one or more circuits, logics, or cells included in a functional circuit include, but are not limited to, AND, OR, NAND, NOR, XOR, INV, OR-AND-Invert (OAI), MUX, Flip-flop, BUFF, Latch, delay, clock, memory such as static random-access memory (SRAM), de-coupling capacitor, analog amplifier, logic driver, digital driver, or the like. In some embodiments, the circuits, logics, or cells included in functional circuits include functional transistors or core transistors which are to be protected from the antenna effect during the manufacture of the IC device 100. Examples of transistors in the functional circuits, as well as in the other circuits described herein, include, but are not limited to, metal oxide semiconductor field effect transistors (MOSFET), complementary metal oxide semiconductors (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like. In the example configuration in FIG. 1, each of the functional devices 123, 124 is electrically coupled as a de-coupling capacitor, whereas the functional devices 125, 126 together configure an inverter or a driver. The functional devices 121, 122 are examples of functional devices configured for other purposes or functionality. In some embodiments, the to-be-protected devices 120 include one or more further antenna effect protection devices, as described herein.

Gates G of the to-be-protected devices 120 are electrically coupled to a conductor 130. The conductor 130 is electrically coupled to the antenna effect protection devices MP, MN. During the manufacturing/fabricating process of the IC device 100, positive or negative electric charges are potentially accumulated on the conductor 130. As described herein, in some embodiments, the antenna effect protection devices MP, MN are configured to discharge the accumulated electric charges from the conductor 130 and also from the gates G electrically coupled to the conductor 130. As a result, in one or more embodiments, the gates G of the to-be-protected devices 120 are not subject to an excessive amount of accumulated electric charges, and the underlying gate dielectrics of the to-be-protected devices 120 are protected from being damaged (e.g., broken down) due to excessively accumulated electric charges.

The antenna effect protection devices MP, MN together configure an antenna effect protection circuit. As described herein, in one or more embodiments, the antenna effect protection circuit comprises either of the antenna effect protection devices MP, MN, whereas the other of the antenna effect protection devices MP, MN is omitted.

The antenna effect protection device MP is a P-type transistor, e.g., a PMOS transistor. Antenna effect protection devices configured by PMOS transistors are sometimes referred to as antenna PMOSs. The antenna effect protection device, or antenna PMOS, MP comprises a gate GP, a first source/drain SP and a second source/drain DP. In an example, the first source/drain SP is a source of the antenna PMOS MP, and the second source/drain DP is a drain of the antenna PMOS MP. The first source/drain SP of the antenna PMOS MP is electrically coupled to a conductor 131, and the second source/drain DP of the antenna PMOS MP is electrically coupled to the conductor 130. The conductor 131 is configured to carry a first reference voltage. In the example configuration in FIG. 1, the first reference voltage is a positive power supply voltage VDD, and the conductor 131 is a VDD power rail. Other voltage values of the first reference voltage are within the scopes of various embodiments.

The electrical connection to, or control of, the gate GP of the antenna PMOS MP is in a state sometimes referred to as a “don’t care” state. In some embodiments, the “don’t care” state includes any electrical connection to, or control of, the gate GP that does not cause the antenna PMOS MP to interfere with intended operations or functions of the to-be-protected devices 120 and/or the functional circuits including the to-be-protected devices 120. In the example configuration in FIG. 1, the gate GP is coupled to the conductor 131. As a result, the antenna PMOS MP is electrically coupled in a turned OFF state, and does not affect functionality of the IC device 100 during normal operation after the manufacturing process. The antenna PMOS MP having the gate GP electrically coupled to the conductor 131, which is a VDD power rail, is sometimes referred to as a gate-VDD PMOS (GDPMOS). In at least one embodiment, the gate GP is floating. In one or more embodiments, the gate GP is electrically coupled to a source/drain of a further antenna effect protection device, to be protected from the antenna effect by the further antenna effect protection device, e.g., as described with respect to FIG. 4.

The antenna PMOS MP is a bulk-less device. In a bulk-less device, an intrinsic body diode is absent. The antenna PMOS MP is configured to discharge electric charges on the conductor 130 by a leakage current or a channel current.

In some embodiments, in response to a reversed bias applied between the first source/drain SP and the second source/drain DP of the antenna PMOS MP, i.e., in response to a potential on the conductor 130 being lower than a potential on the conductor 131, the antenna PMOS MP is configured to discharge negative electric charges on the conductor 130 to the conductor 131 by a leakage current of the antenna PMOS MP. In at least one embodiment, the leakage current is $I_{Boff}$ of the antenna PMOS MP. As a result, stress on the gates G of the to-be-protected devices 120 due to accumulated negative electric charges is relieved or avoided.

In some embodiments, in response to a forward bias applied between the first source/drain SP and the second source/drain DP of the antenna PMOS MP. i.e., in response to the potential on the conductor 130 being higher than the potential on the conductor 131, the antenna PMOS MP is configured to discharge positive electric charges on the conductor 130 to the conductor 131 by a channel current of the antenna PMOS MP. As a result, stress on the gates G of the to-be-protected devices 120 due to accumulated positive electric charges is relieved or avoided. One of the positive and negative electric charges are examples of electric charges of a first polarity, and the other of the positive and negative electric charges are examples of electric charges of a second polarity opposite to the first polarity.

The antenna effect protection device MN is an N-type transistor, e.g., a NMOS transistor. Antenna effect protection devices configured by NMOS transistors are sometimes referred to as antenna NMOSs. The antenna effect protection device, or antenna NMOS, MN comprises a gate GN, a first source/drain SN and a second source/drain DN. In an example, the first source/drain SN is a source of the antenna NMOS MN, and the second source/drain DN is a drain of the antenna NMOS MN. The first source/drain SN of the antenna NMOS MN is electrically coupled to a conductor 132, and the second source/drain DN of the antenna NMOS MN is electrically coupled to the conductor 130. The conductor 132 is configured to carry a second reference voltage. In the example configuration in FIG. 1, the second reference voltage is a ground voltage VSS, and the conductor 132 is a VSS power rail. Other voltage values of the second reference voltage are within the scopes of various embodiments.

The electrical connection to, or control of, the gate GN of the antenna NMOS MN is the "don't care" state. In some embodiments, the "don't care" state includes any electrical connection to, or control of, the gate GN that does not cause the antenna NMOS MN to interfere with intended operations or functions of the to-be-protected devices 120 and/or the functional circuits including the to-be-protected devices 120. In the example configuration in FIG. 1, the gate GN is coupled to the conductor 132. As a result, the antenna NMOS MN is electrically coupled in a turned OFF state, and does not affect functionality of the IC device 100 during normal operation after the manufacturing process. The antenna NMOS MN having the gate GN electrically coupled to the conductor 132, which is a VSS power rail, is sometimes referred to as a grounded-gate NMOS (GGNMOS). In at least one embodiment, the gate GN is floating. In one or more embodiments, the gate GN is electrically coupled to a source/drain of a further antenna effect protection device, to be protected from the antenna effect by the further antenna effect protection device, e.g., as described with respect to FIG. 4.

The antenna NMOS MN is a bulk-less device, and is configured to discharge electric charges on the conductor 130 by a leakage current or a channel current.

In some embodiments, in response to a reversed bias applied between the first source/drain SN and the second source/drain DN of the antenna NMOS MN, i.e., in response to the potential on the conductor 130 being higher than a potential on the conductor 132, the antenna NMOS MN is configured to discharge positive electric charges on the conductor 130 to the conductor 132 by a leakage current of the antenna NMOS MN. In at least one embodiment, the leakage current is $I_{Boff}$ of the antenna NMOS MN. As a result, stress on the gates G of the to-be-protected devices 120 due to accumulated positive electric charges is relieved or avoided.

In some embodiments, in response to a forward bias applied between the first source/drain SN and the second source/drain DN of the antenna NMOS MN, i.e., in response to the potential on the conductor 130 being lower than the potential on the conductor 132, the antenna NMOS MN is configured to discharge negative electric charges on the conductor 130 to the conductor 132 by a channel current of the antenna NMOS MN. As a result, stress on the gates G of the to-be-protected devices 120 due to accumulated negative electric charges is relieved or avoided.

In some embodiments, the described discharge of positive or negative electric charges through one or more of the antenna PMOS MP and antenna NMOS MN occurs during the manufacturing process of the IC device 100, and protects the gate dielectrics of the to-be-protected devices 120 from being damaged due to the antenna effect. Because each of the antenna PMOS MP and antenna NMOS MN is configured to discharge both positive and negative electric charges from the conductor 130 and the gates G of the to-be-protected devices 120, it is possible to omit one of the antenna PMOS MP and antenna NMOS MN in one or more embodiments.

Figure 2A:
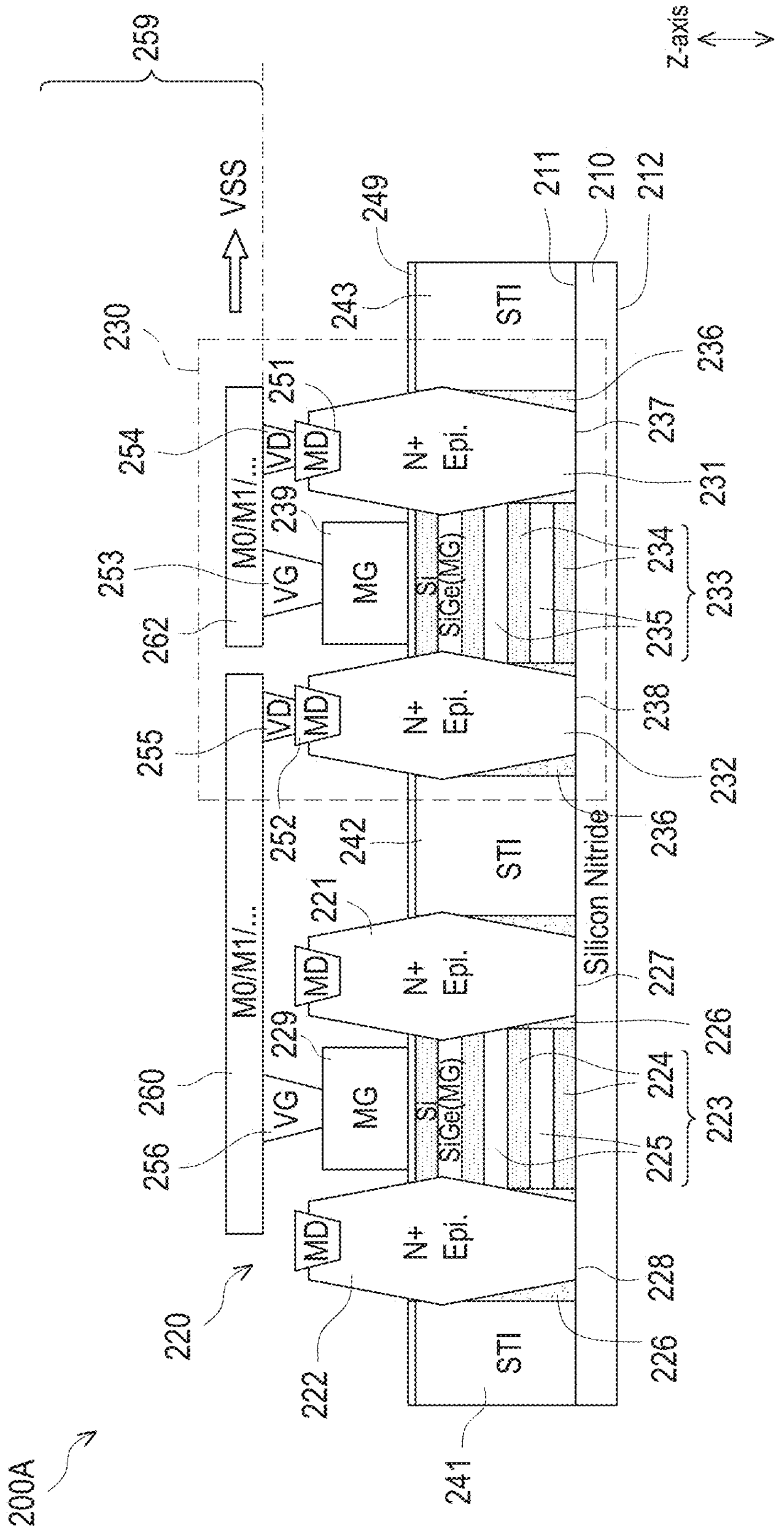
FIGS. 2A-2E are schematic cross-sectional views of various IC devices, in accordance with some embodiments.

FIG. 2A is a schematic cross-sectional view of an IC device 200A, in accordance with some embodiments. In some embodiments, the IC device 200A corresponds to the IC device 100.

The IC device 200A comprises an insulation layer 210 having a front side 211, and a back side 212 opposite to the front side 211 in a thickness direction of the insulation layer 210. The thickness direction of the insulation layer 210 is also a thickness direction of the IC device 200A, and is designated as Z-axis in the drawings. In the example configuration in FIG. 2A, the insulation layer 210 comprises a silicon nitride. Other non-conductive materials of the insulation layer 210, such as SiO, $SiO_2$, combinations thereof, or the like, are within the scopes of various embodiments. In some embodiments, the insulation layer 210 is a buried insulation layer of a silicon-on-insulator (SOI) substrate where the insulation layer 210 remains after a bulk of the SOI substrate has been removed, e.g., by wafer thinning, during the manufacturing processes. In one or more embodiments, the insulation layer 210 is deposited or regrown after the wafer thinning. Other manners and/or processes for forming the insulation layer 210 are within the scopes of various embodiments.

The IC device 200A further comprises, over the front side 211 of the insulation layer 210, a to-be-protected device 220 and an antenna effect protection device 230. In some embodiments, the to-be-protected device 220 corresponds to a functional device such as one of the to-be-protected devices 120, or to a further antenna effect protection device. In the example configuration in FIG. 2A, the to-be-protected device 220 comprises an NMOS transistor. The to-be-protected device 220 comprises a PMOS transistor in one or more embodiments. In some embodiments, the antenna effect protection device 230 comprises an NMOS transistor and/or corresponds to the antenna NMOS MN. The antenna effect protection device 230 is referred to herein as antenna NMOS 230.

The to-be-protected device 220 comprises a first source/drain feature 221, a second source/drain feature 222, and a channel region 223 between the first source/drain feature 221 and second source/drain feature 222. In the example configuration in FIG. 2A, the channel region 223 comprises a multilayer stack of layers 224, 225 alternatingly arranged in the Z-axis. The layers 224 comprise a semiconductor material, such as Si, and are configured to form a plurality of nanosheets in the channel region 223. The layers 225 comprise a sacrificial material, such as SiGe, or a metal gate designated as "MG" in the drawings. The described materials of the layers 224, 225 are examples. Other materials for the layers 224, 225 are within the scopes of various embodiments. The described nanosheets in the channel region 223 configure the to-be-protected device 220 as a nanosheet transistor, and is an example. Other types of transistor, such as nanowire, FinFET, planar, or the like, are within the scopes of various embodiments.

Each of the first source/drain feature 221 and second source/drain feature 222 comprises an N-type epitaxy structure designated as "N+ Epi." in the drawings. In one or more embodiments where the to-be-protected device 220 is a PMOS transistor, the first source/drain feature 221 and second source/drain feature 222 are P-type epitaxy structures. In some embodiments, the first source/drain feature 221 and second source/drain feature 222 are grown by epitaxy processes. Other structures and/or manufacturing processes for the first source/drain feature 221 and second source/drain feature 222 are within the scopes of various embodiments. In some embodiments, the first source/drain feature 221 and second source/drain feature 222 are formed in a correspondingly doped well 226. In at least one embodiment, the doped well 226 is omitted.

The to-be-protected device 220 is a bulk-less device which lacks (i.e., is free of) a semiconductor layer that connects a bottom 227 of the first source/drain feature 221 and a bottom 228 of the second source/drain feature 222. The insulation layer 210 electrically isolates the bottom 227 of the first source/drain feature 221 from the bottom 228 of the second source/drain feature 222. In some embodiments, at least one of the bottom 227 of the first source/drain feature 221 or the bottom 228 of the second source/drain feature 222 is in direct contact with the front side 211 of the insulation layer 210.

The to-be-protected device 220 further comprises a gate 229. In the example configuration in FIG. 2A, the gate 229 is a metal gate. Other gate materials, such a polysilicon, are within the scopes of various embodiments. In some embodiments, where the gate 229 is an all-around gate, the gate material of the gate 229 replaces the sacrificial material of the layers 225.

The to-be-protected device 220 further comprises a gate dielectric (not shown for simplicity) between the gate material of the gate 229 and the nanosheets configured by the layers 224. Such a gate dielectric is potentially subject to electric charges, and is protected by the antenna NMOS 230, during manufacturing processes of the IC device 200A.

The antenna NMOS 230 comprises components corresponding to the described components of the to-be-protected device 220. Specifically, the antenna NMOS 230 comprises a first source/drain feature 231, a second source/drain feature 232, a channel region 233, alternating layers 234, 235, a doped well 236, and a gate 239 which correspond to the first source/drain feature 221, second source/drain feature 222, channel region 223, layers 224, 225, doped well 236, and gate 229 of the to-be-protected device 220. The antenna NMOS 230 further comprises a gate dielectric (not shown) corresponding to the gate dielectric of the to-be-protected device 220. In some embodiments, the doped well 236 is omitted.

Similarly to the to-be-protected device 220, the antenna NMOS 230 is a bulk-less device which lacks (i.e., is free of) a semiconductor layer that connects a bottom 237 of the first source/drain feature 231 and a bottom 238 of the second source/drain feature 232. The insulation layer 210 electrically isolates the bottom 237 of the first source/drain feature 231 from the bottom 238 of the second source/drain feature 232. In some embodiments, at least one of the bottom 237 of the first source/drain feature 231 or the bottom 238 of the second source/drain feature 232 is in direct contact with the front side 211 of the insulation layer 210. Further detailed descriptions of the components of the antenna NMOS 230 are omitted for simplicity.

The IC device 200A further comprises, over the front side 211 of the insulation layer 210, a plurality of shallow trench isolation (STI) regions 241, 242, 243 which electrically isolate the source/drain features of adjacent transistors from each other. In the example configuration in FIG. 2A, the first source/drain feature 221 of the to-be-protected device 220 is adjacent to, and electrically isolated by the STI region 242 from, the second source/drain feature 232 of the antenna NMOS 230. In some embodiments, there are one or more further semiconductor devices and/or STI regions between the to-be-protected device 220 and the antenna NMOS 230.

The IC device 200A further comprises a liner layer 249 over the channel regions 223, 233 and the STI regions 241-243. In some embodiments, the liner layer 249 includes a dielectric material, such as silicon oxide (SiO), silicon nitride (SiN), other dielectric materials, combinations thereof, or the like. In some embodiments, the liner layer 249 is omitted.

The IC device 200A further comprises contact structures over and in electrical contact with corresponding source/drain features 221, 222, 231, 232 of the to-be-protected device 220 and antenna NMOS 230. Contact structures are sometimes referred to as metal-to-device structures, and are schematically illustrated in the drawings with the label "MD." MD contact structures include a conductive material, e.g., a metal, formed over corresponding source/drain features to define electrical connections among semiconductor devices of the IC device 200A, to form one or more functional circuits and/or antenna effect protection devices. In the example configuration in FIG. 2A, the antenna NMOS 230 comprises MD contact structures 251, 252 correspondingly over and in electrical contact with the source/drain features 231, 232. For simplicity, other MD contact structures of the IC device 200A in FIG. 2A are not numbered.

The IC device 200A further comprises vias over and in electrical contact with the corresponding gates or MD contact structures. A via over and in electrical contact with an MD contact structure is sometimes referred to as via-to-device (VD). A via over and in electrical contact with a gate is sometimes referred to as via-to-gate (VG). VD and VG vias are schematically illustrated in the drawings with the corresponding labels "VD" and "VG." An example material of the VD and VG vias includes metal. Other configurations are within the scopes of various embodiments. In the example configuration in FIG. 2A, the antenna NMOS 230 comprises a VG via 253, and VD vias 254, 255 correspondingly over and in electrical contact with the gate 239, and MD contact structures 251, 252. The to-be-protected device 220 comprises a VG via 256 over and in electrical contact with the gate 229. For simplicity, other VG and/or VD vias of the IC device 200A in FIG. 2A are not shown or numbered.

The IC device 200A further comprises a redistribution structure 259 which is over the VD, VG vias. The redistribution structure 259 comprises a plurality of metal layers and via layers sequentially and alternatingly arranged over the VD, VG vias. The redistribution structure 259 further comprises various interlayer dielectric (ILD) layers (not shown) in which the metal layers and via layers are embedded. The metal layers and via layers of the redistribution structure 259 are configured to electrically couple various elements or circuits of the IC device 200A with each other, and with external circuitry. In the redistribution structure 259, the lowermost metal layer immediately over and in electrical contact with the VD, VG vias is an M0 (metal-zero) layer, a next metal layer immediately over the M0 layer is an M1 layer, a next metal layer immediately over the M1 layer is an M2 layer, or the like. Conductive patterns in the M0 layer are referred to as M0 conductive patterns, conductive patterns in the M1 layer are referred to as M1 conductive patterns, or the like. A via layer Vn is arranged between and electrically couple the Mn layer and the Mn+1 layer, where n is an integer from zero and up. For example, a via-zero (V0) layer is the lowermost via layer which is arranged between and electrically couple the M0 layer and the M1 layer. Other via layers are V1, V2, or the like. Vias in the V0 layer are referred to as V0 vias, vias in the V1 layer are referred to as V1 vias, or the like. For simplicity, metal layers and via layers in the redistribution structure 259 are not fully illustrated in FIG. 2A.

The redistribution structure 259 comprises a conductor 260 electrically coupling the VG via 256 of the to-be-protected device 220 to the VD via 255 of the antenna NMOS 230. The redistribution structure 259 further comprises a conductor 262 electrically coupling the VG via 253 and the VD via 254 of the antenna NMOS 230. In the example configuration in FIG. 2A, each of the conductors 260, 262 comprises an M0 conductive pattern. In some embodiments, at least one of the conductor 260 or conductor 262 comprises several conductive patterns in several metal layers (e.g., the M0 layer, M1 layer, or the like) and several vias in one or more via layers (e.g., the V0 layer, V1 layer, or the like) electrically coupling the conductive patterns together. The conductors 260, 262 are sometimes referred to as interconnects.

The redistribution structure 259 and interconnects therein are formed over the front side 211, and are sometimes referred to as the front side redistribution structure and front side interconnects. In some embodiments, the IC device 200A further comprises a back side redistribution structure and corresponding back side interconnects on the back side 212. An example back side redistribution structure is described herein with respect to FIG. 2C. In at least one embodiment, the back side redistribution structure comprises a power delivery network configured to deliver power supply voltages, reference voltages and/or ground voltages to the circuitry on the front side 211. For example, the power delivery network in the back side redistribution structure comprises back side VDD power rails and back side VSS power rails which are electrically coupled, by corresponding feed through vias (FTVs), to corresponding front side VDD power rails and front side VSS power rails in the redistribution structure 259. The circuitry of the IC device 200A is electrically coupled to, and powered by, the VDD power rails and VSS power rails. A back side power delivery network is sometimes referred to as a super power rail (SPR) structure.

In some embodiments, the gate 229 of the to-be-protected device 220 corresponds to the gate G of one of the to-be-protected devices 120, the conductor 260 corresponds to the conductor 130, the second source/drain feature 232, gate 239 and first source/drain feature 231 of the antenna NMOS 230 correspond to the second source/drain DN, gate GN and first source/drain SN of the antenna NMOS MN, and the conductor 262 corresponds to the conductor 132. In at least one embodiment, the conductor 262 is configured to carry a reference voltage, e.g., the ground voltage VSS, of the IC device 200A. For example, the conductor 262 comprises, or is electrically coupled to, a VSS power rail of the IC device 200A. In operation of the IC device 200A, the ground voltage VSS is applied through the conductor 262 to the gate 239, and keeps the antenna NMOS 230 in the turned OFF state, thereby preventing the antenna NMOS 230 from affecting normal operations of various circuits and/or elements of the IC device 200A, including the to-be-protected device 220.

In some embodiments, the antenna NMOS 230 is configured to provide antenna effect protection for the gate dielectric of the to-be-protected device 220 in a manner similar to that described with respect to FIG. 1. For example, in response to a reversed bias, i.e., in response to a potential on the conductor 260 being higher than a potential on the conductor 262, the antenna NMOS 230 is configured to discharge positive electric charges on the conductor 260 to the conductor 262 by a leakage current of the antenna NMOS 230. In response to a forward bias, i.e., in response to the potential on the conductor 260 being lower than the potential on the conductor 262, the antenna NMOS 230 is configured to discharge negative electric charges on the conductor 260 to the conductor 262 by a channel current of the antenna NMOS 230. As a result, stress on the gate G of the to-be-protected device 220 due to accumulated positive or negative electric charges is relieved or avoided in one or more embodiments.

Figure 2B:
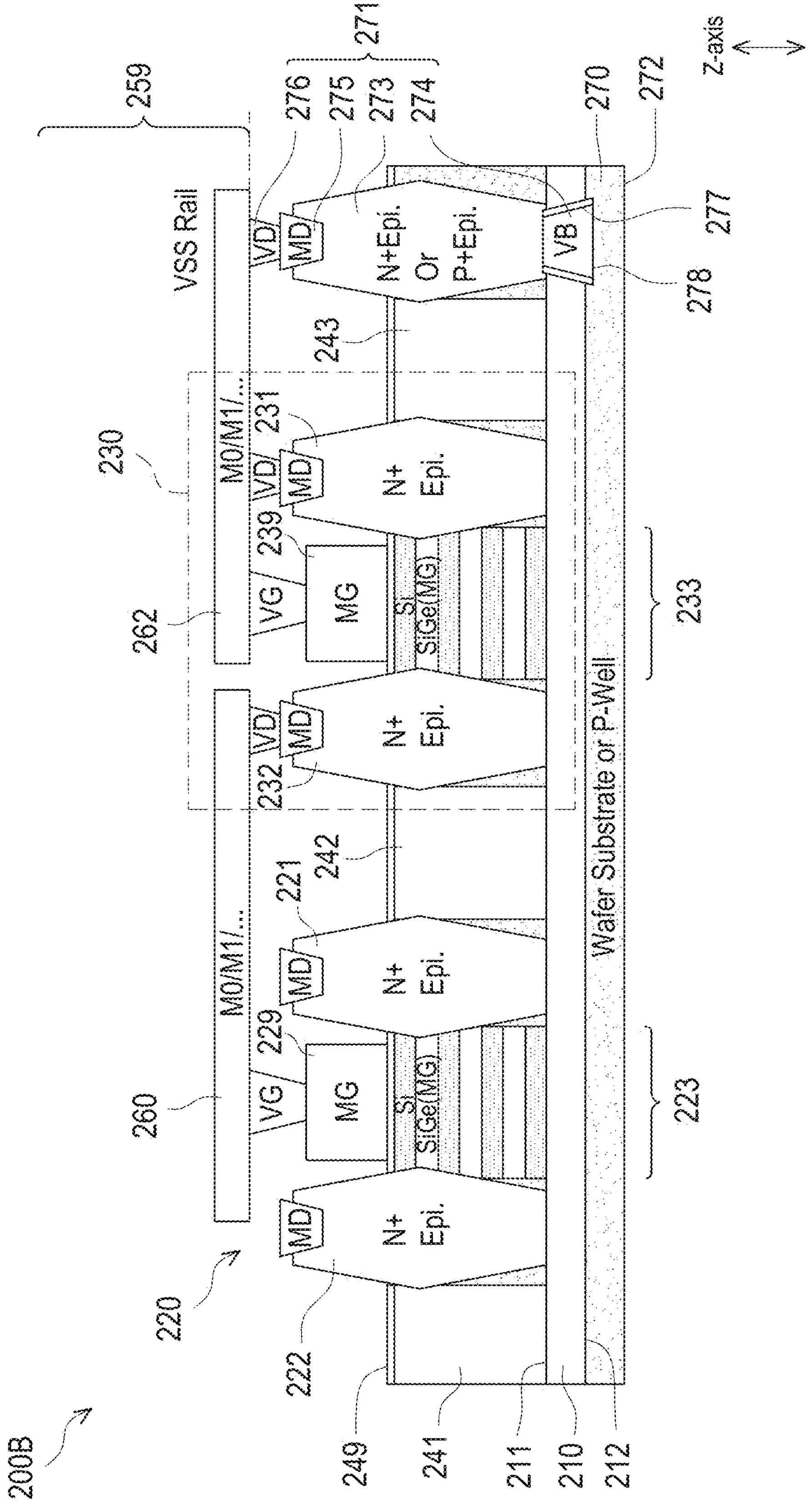

FIG. 2B is a schematic cross-sectional view of an IC device 200B, in accordance with some embodiments. In some embodiments, the IC device 200B corresponds to the IC device 100. For simplicity, corresponding components of the IC devices 200A, 200B are designated by the same reference numerals.

Compared to the IC device 200A, the IC device 200B further comprises a semiconductor layer 270 on the back side 212 of the insulation layer 210, and a conductive structure 271 extending through the insulation layer 210 and electrically coupling the conductor 262 on the front side 211 to the back side 212 of the insulation layer 210.

The semiconductor layer 270 comprises a front side (not numbered) in contact with the back side 212 of the insulation layer 210, and a back side 272. In the example configuration in FIG. 2B, the semiconductor layer 270 comprises a wafer substrate or a P-well. In some embodiments, the semiconductor layer 270 comprises a P-type substrate. Other materials or configurations of the semiconductor layer 270 are within the scopes of various embodiments.

In the example configuration in FIG. 2B, the conductive structure 271 comprises an epitaxy structure 273, and a feed through via (FTV) 274 which is designated as "VB" in the drawings. The epitaxy structure 273 comprises a front end, or upper end, electrically coupled to the conductor 262 by an MD contact structure 275 and a VD via 276. The epitaxy structure 273 further comprises a back end, or lower end, electrically coupled to the FTV 274. In some embodiments, the epitaxy structure 273 is configured and/or manufactured as a source/drain feature of an NMOS transistor. In this example, the epitaxy structure 273 comprises an N-type epitaxy structure, similarly to the source/drain features 221, 222, 231, 232. In some embodiments, the epitaxy structure 273 is configured and/or manufactured as a source/drain feature of a PMOS transistor. In this example, the epitaxy structure 273 comprises a P-type epitaxy structure (designated as "P+ Epi." in the drawings), as described herein. In at least one embodiment, although the epitaxy structure 273 is configured and/or manufactured as a source/drain feature, there is no gate associated with the epitaxy structure 273 to form a transistor.

In at least one embodiment, the epitaxy structure 273 comprises a tap structure that configures a substrate tap or a well tap. The epitaxy structure 273 is located outside, and is electrically isolated by the STI region 243 from, the source/drain features of transistors of the IC device 200B, such as the to-be-protected device 220 and the antenna NMOS 230. In an example, the epitaxy structure 273 comprises a substrate tap when the semiconductor layer 270 comprises a semiconductor substrate, e.g., a P-type substrate. In a further example, the epitaxy structure 273 comprises a well tap when the semiconductor layer 270 comprises a P-well. The substrate tap or well tap is electrically coupled to a VSS power rail configured by the conductor 262, which is configured to deliver the ground voltage VSS to the corresponding substrate or well to prevent latch-up issues in operations of the IC device 200B. The ground voltage VSS on the conductor 262 electrically coupled to the gate 239 keeps the antenna NMOS 230 in the turned OFF state, thereby preventing the antenna NMOS 230 from affecting normal operations of various circuits and/or elements of the IC device 200B.

The FTV 274 comprises a conductive material, such as a metal, and extends through the insulation layer 210. In the example configuration in FIG. 2B, a liner 277, e.g., an insulation layer, is deposited on a sidewall of the FTV 274. In at least one embodiment, the liner 277 is omitted. The FTV 274 has a front end, or upper end, in electrical contact with the lower end of the epitaxy structure 273, and a back end, or lower end, 278. In the example configuration in FIG. 2B, the lower end 278 of the FTV 274 is embedded in the semiconductor layer 270. This is an example. In some embodiments, the lower end 278 of the FTV 274 is flush with the back side 212 of the insulation layer 210, which is also the front side of the semiconductor layer 270. In at least one embodiment, the lower end 278 of the FTV 274 is flush with the back side 272 of the semiconductor layer 270. The described conductive structure 271 having the epitaxy structure 273 and the FTV 274 for electrically coupling the conductor 262 on the front side to the back side is an example. Other conductive structure configurations are within the scopes of various embodiments. For example, in one or more embodiments where substrate taps or well taps comprise tap structures other than epitaxy structures, the epitaxy structure 273 is omitted and replaced by the corresponding tap structure, e.g., a doped well. In a further example, a tap structure with the associated MD contact structure and VD via are omitted in a conductive structure which comprises an FTV extending all the way from the back side 212 of the insulation layer 210 to the conductor 262. In some embodiments, the IC device 200B further comprises a back side redistribution structure on the back side 272 of the semiconductor layer 270.

In at least one embodiment, the antenna NMOS 230 in the IC device 200B is configured to provide antenna effect protection for the to-be-protected device 220 in manners similar to those described with respect to FIG. 2A. In particular, positive or negative electric charges accumulated on the conductor 260 are discharged correspondingly by a leakage current or a channel current of the antenna NMOS 230 to the conductor 262. In at least one embodiment, one or more advantages described herein are achievable by the IC device 200B.

Figure 2C:
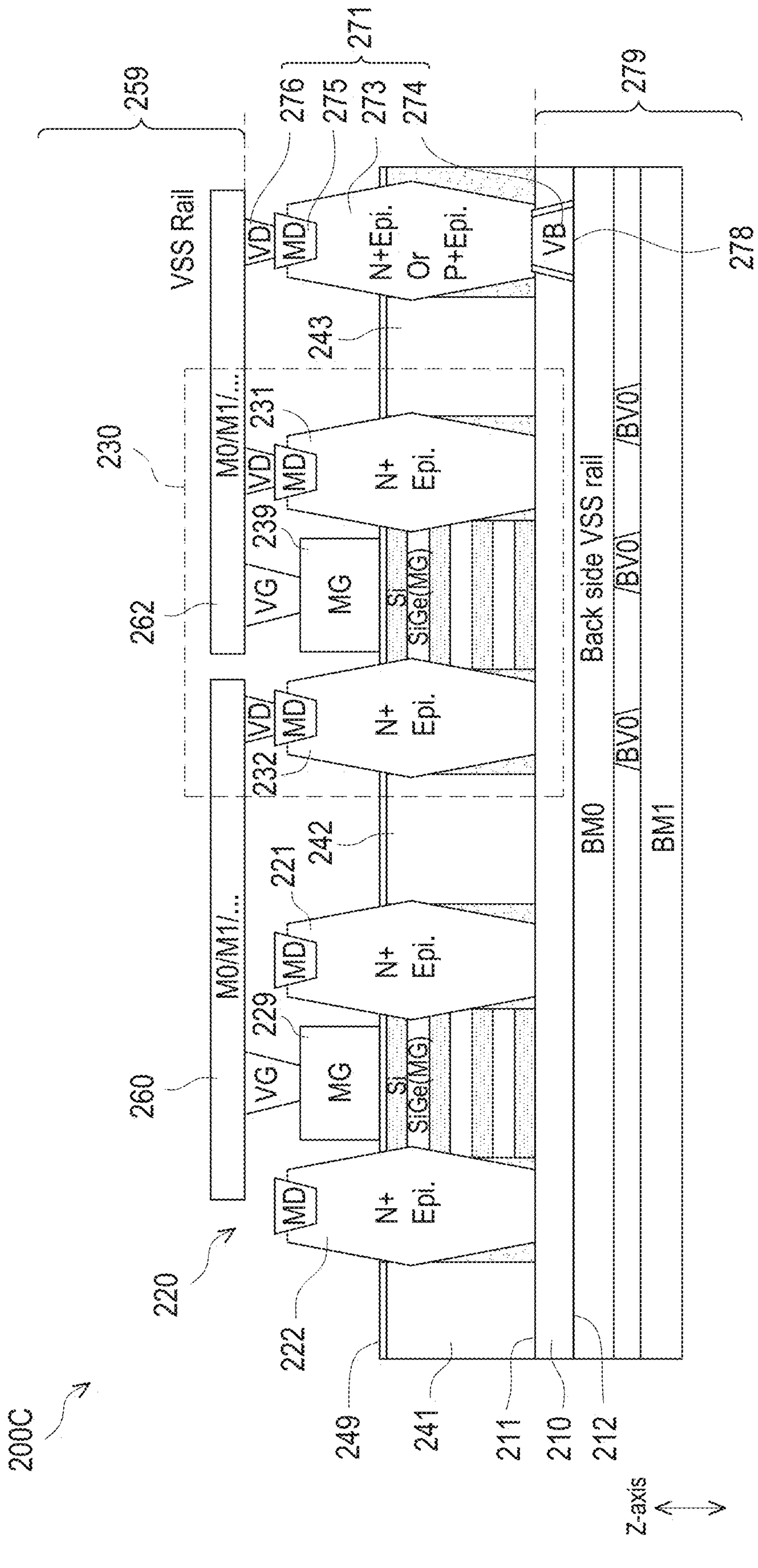

FIG. 2C is a schematic cross-sectional view of an IC device 200C, in accordance with some embodiments. In some embodiments, the IC device 200C corresponds to the IC device 100. For simplicity, corresponding components of the IC devices 200A-200C are designated by the same reference numerals.

Compared to the IC device 200B, the IC device 200C does not comprise the semiconductor layer 270. The IC device 200C comprises a back side redistribution structure 279 on the back side 212 of the insulation layer 210.

The back side redistribution structure 279 comprises a plurality of back side metal layers and a plurality of back side via layers arranged alternatingly in the thickness direction of the insulation layer 210, i.e., along the Z-axis. The back side redistribution structure 279 further comprises various interlayer dielectric (ILD) layers in which the back side metal layers and back side via layers are embedded. The back side metal layers and back side via layers of the back side redistribution structure 279 are configured to supply power and/or signals from external circuitry to various elements or circuits of the IC device 200C. The back side metal layer immediately adjacent the back side 212 of the insulation layer 210 is a back side M0 (BM0) layer, a next back side metal layer is a back side M1 (BM1) layer, or the like. A back side via layer BVn is arranged between and electrically couples the BMn layer and the BMn+1 layer, where n is an integer from zero and up. For example, a via layer BV0 is the back side via layer arranged between and electrically couples the BM0 layer and the BM1 layer. Other back side via layers are BV1, BV2, or the like. For simplicity, back side metal layers and back side via layers in the back side redistribution structure 279 are not fully illustrated in FIG. 2C.

In the example configuration in FIG. 2C, the lower end 278 of the FTV 274 is flush with the back side 212 of the insulation layer 210. The BM0 layer is on the back side 212 of the insulation layer 210, and comprises a BM0 conductive pattern in electrical contact with the lower end 278 of the FTV 274. The BM0 conductive pattern is electrically coupled to, or comprises, a back side VSS power rail of a power delivery network configured in the back side redistribution structure 279. In some embodiments, the power delivery network comprises a further BM0 conductive pattern (not shown in FIG. 2C) which is electrically coupled to, or comprises, a back side VDD power rail. In some embodiments, the back side VSS and VDD power rails in the BM0 layer are electrically coupled, through one or more back side via layers and one or more back side metal layers, to a top back side metal layer to receive corresponding power supply voltages from an external power source. The ground voltage VSS is delivered through the power delivery network in the back side redistribution structure 279, then through the conductive structure 271, to the conductor 262 which is a VSS power rail on the front side. In the IC device 200C, the epitaxy structure 273 is configured for both VSS power delivery from the back side to the front side, and as a substrate tap or well tap. The ground voltage VSS delivered to the conductor 262 electrically coupled to the gate 239 keeps the antenna NMOS 230 in the turned OFF state, thereby preventing the antenna NMOS 230 from affecting normal operations of various circuits and/or elements of the IC device 200C.

The power supply voltage VDD is delivered in a similar manner through the power delivery network in the back side redistribution structure 279, then through a further conductive structure similar to the conductive structure 271, to a VDD power rail on the front side. In some embodiments, a further epitaxy structure in the further conductive structure is configured for both VDD power delivery from the back side to the front side, and as a substrate tap or well tap.

In at least one embodiment, the antenna NMOS 230 in the IC device 200C is configured to provide antenna effect protection for the to-be-protected device 220 in manners similar to those described with respect to FIGS. 2A, 2B. In particular, positive or negative electric charges accumulated on the conductor 260 are discharged correspondingly by a leakage current or a channel current of the antenna NMOS 230 to the conductor 262. In at least one embodiment, one or more advantages described herein are achievable by the IC device 200C.

Figure 2D:
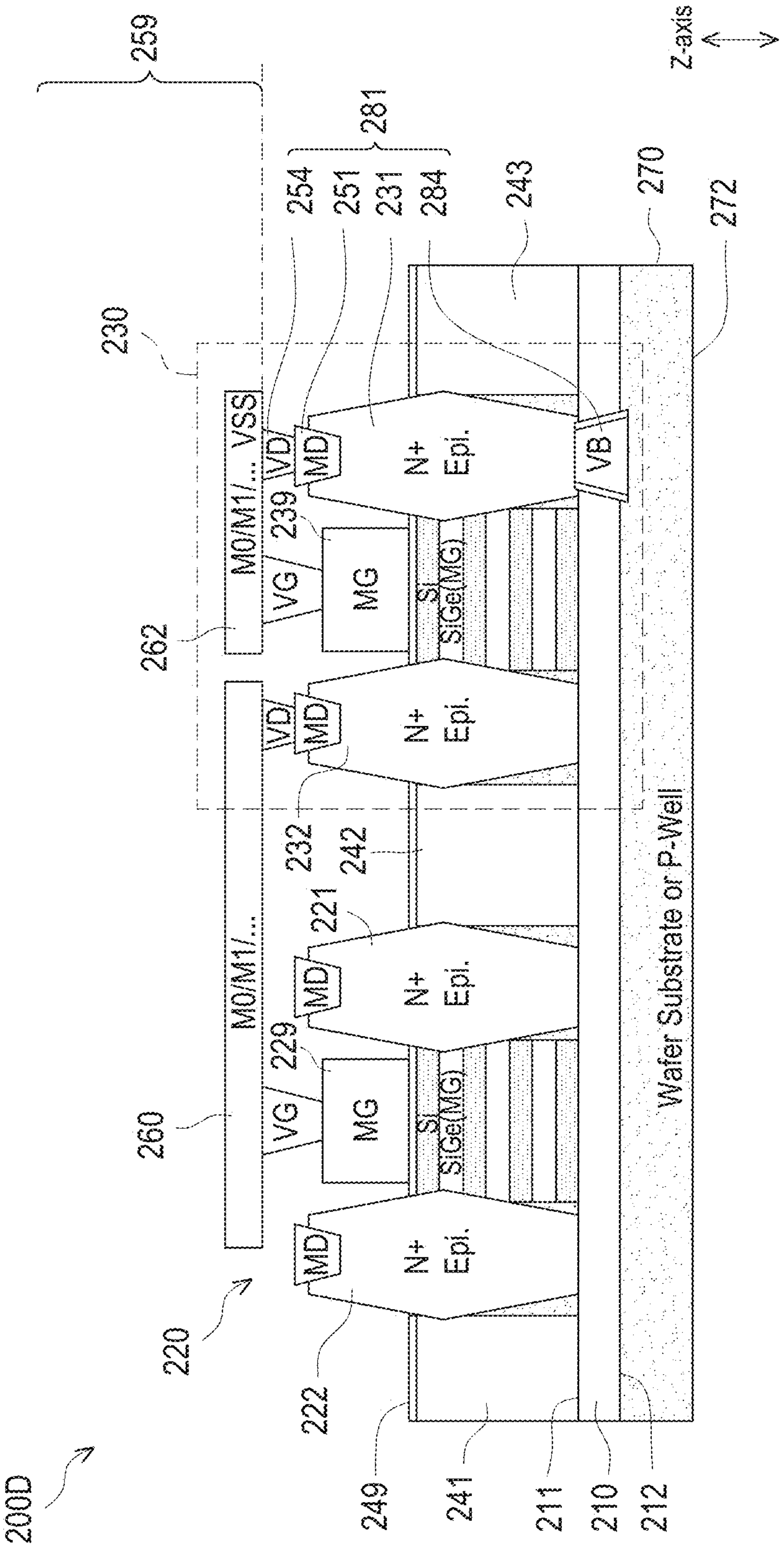

FIG. 2D is a schematic cross-sectional view of an IC device 200D, in accordance with some embodiments. In some embodiments, the IC device 200D corresponds to the IC device 100. For simplicity, corresponding components of the IC devices 200A-200D are designated by the same reference numerals.

Compared to the IC device 200B, the IC device 200D comprises a conductive structure 281 instead of the conductive structure 271. Similar to the conductive structure 271, the conductive structure 281 in the IC device 200D is configured to electrically couple the conductor 262 from the front side to the back side. However, the conductive structure 281 comprises the first source/drain feature 231 of the antenna NMOS 230, instead of a substrate tap or well tap configured by the epitaxy structure 273 outside the antenna NMOS 230 as in the IC device 200B. The conductive structure 281 further comprises an FTV 284 corresponding to the FTV 274, and electrically coupled to a lower end of the first source/drain feature 231. The conductive structure 281 further comprises the MD contact structure 251 and the VD via 254 which electrically couple an upper end of the first source/drain feature 231 to the conductor 262. In some embodiments, the ground voltage VSS is provided to the semiconductor layer 270 by another substrate tap or well tap (not shown), and is then delivered through the conductive structure 281 to the conductor 262. The ground voltage VSS delivered to the conductor 262 electrically coupled to the gate 239 keeps the antenna NMOS 230 in the turned OFF state, thereby preventing the antenna NMOS 230 from affecting normal operations of various circuits and/or elements of the IC device 200D.

In at least one embodiment, the antenna NMOS 230 in the IC device 200D is configured to provide antenna effect protection for the to-be-protected device 220 in manners similar to those described with respect to FIGS. 2A-2C. In particular, positive or negative electric charges accumulated on the conductor 260 are discharged correspondingly by a leakage current or a channel current of the antenna NMOS 230 to the conductor 262. In at least one embodiment, one or more advantages described herein are achievable by the IC device 200D.

Figure 2E:
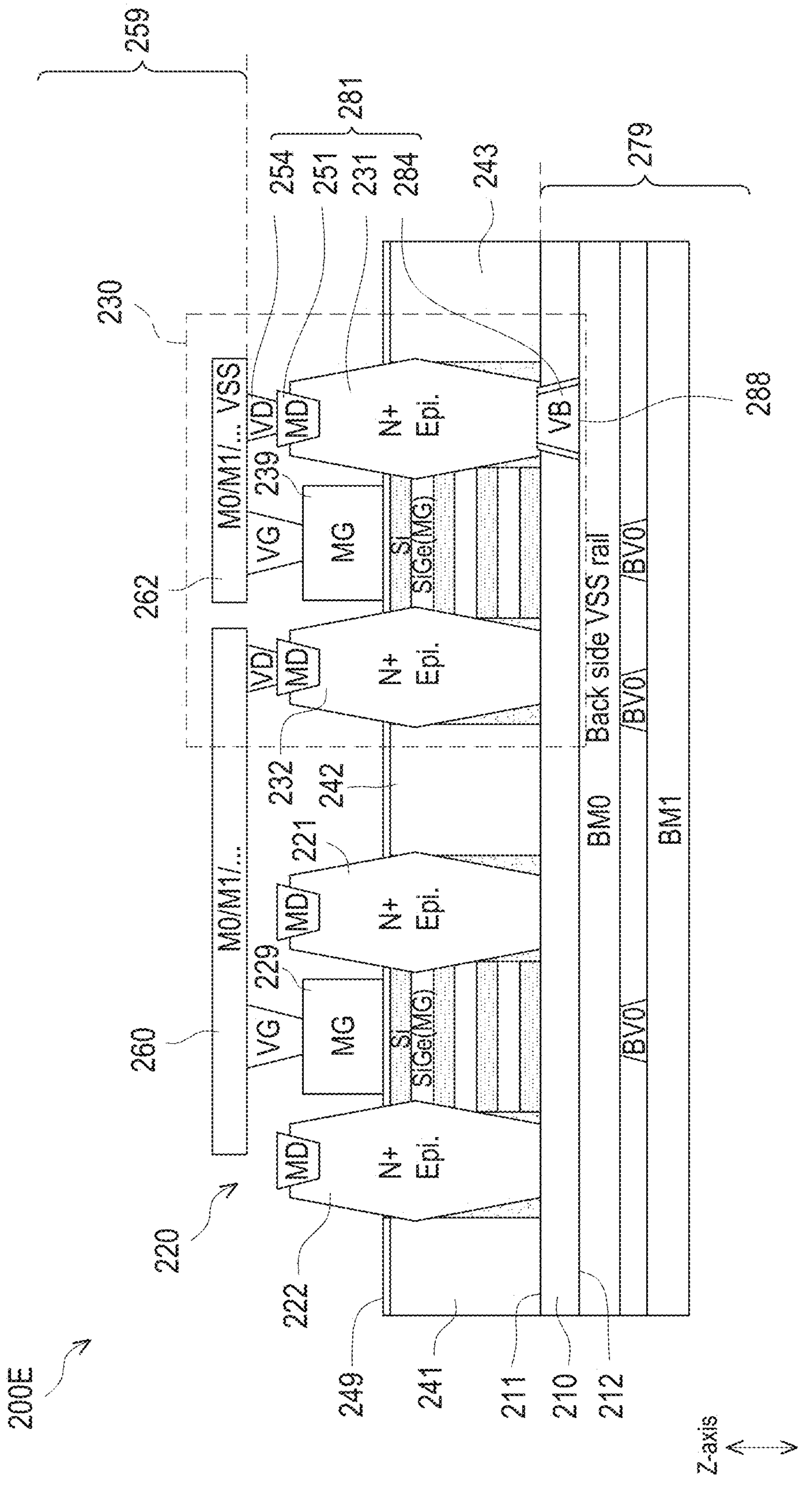

FIG. 2E is a schematic cross-sectional view of an IC device 200E, in accordance with some embodiments. In some embodiments, the IC device 200E corresponds to the IC device 100. For simplicity, corresponding components of the IC devices 200A-200E are designated by the same reference numerals.

Compared to the IC device 200D, the IC device 200E does not comprise the semiconductor layer 270. The IC device 200E comprises the back side redistribution structure 279 on the back side 212 of the insulation layer 210. A lower end 288 of the FTV 284 is flush with the back side 212 of the insulation layer 210. The BM0 layer is on the back side 212 of the insulation layer 210, and comprises a BM0 conductive pattern in electrical contact with the lower end 278 of the FTV 284. The BM0 conductive pattern is electrically coupled to, or comprises, a back side VSS power rail of a power delivery network configured in the back side redistribution structure 279. The ground voltage VSS is delivered through the power delivery network in the back side redistribution structure 279, then through the conductive structure 271, to the conductor 262 which is a VSS power rail on the front side. The ground voltage VSS is applied through the conductor 262 to the gate 239, and keeps the antenna NMOS 230 in the turned OFF state, thereby preventing the antenna NMOS 230 from affecting normal operations of various circuits and/or elements of the IC device 200E.

In at least one embodiment, the antenna NMOS 230 in the IC device 200E is configured to provide antenna effect protection for the to-be-protected device 220 in manners similar to those described with respect to FIGS. 2A-2D. In particular, positive or negative electric charges accumulated on the conductor 260 are discharged correspondingly by a leakage current or a channel current of the antenna NMOS 230 to the conductor 262. In at least one embodiment, one or more advantages described herein are achievable by the IC device 200E.

The descriptions of NMOS transistors as to-be-protected devices and antenna NMOSs given with respect to FIGS. 2A-2E are applicable to PMOS transistors as to-be-protected devices and antenna PMOSs, provided that VSS is changed to VDD and vice versa, and P-type is changed to N-type and vice versa. Examples of PMOS transistors as to-be-protected devices and antenna PMOSs in accordance with some embodiments are described with respect to FIGS. 3A-3E.

Figure 3A:
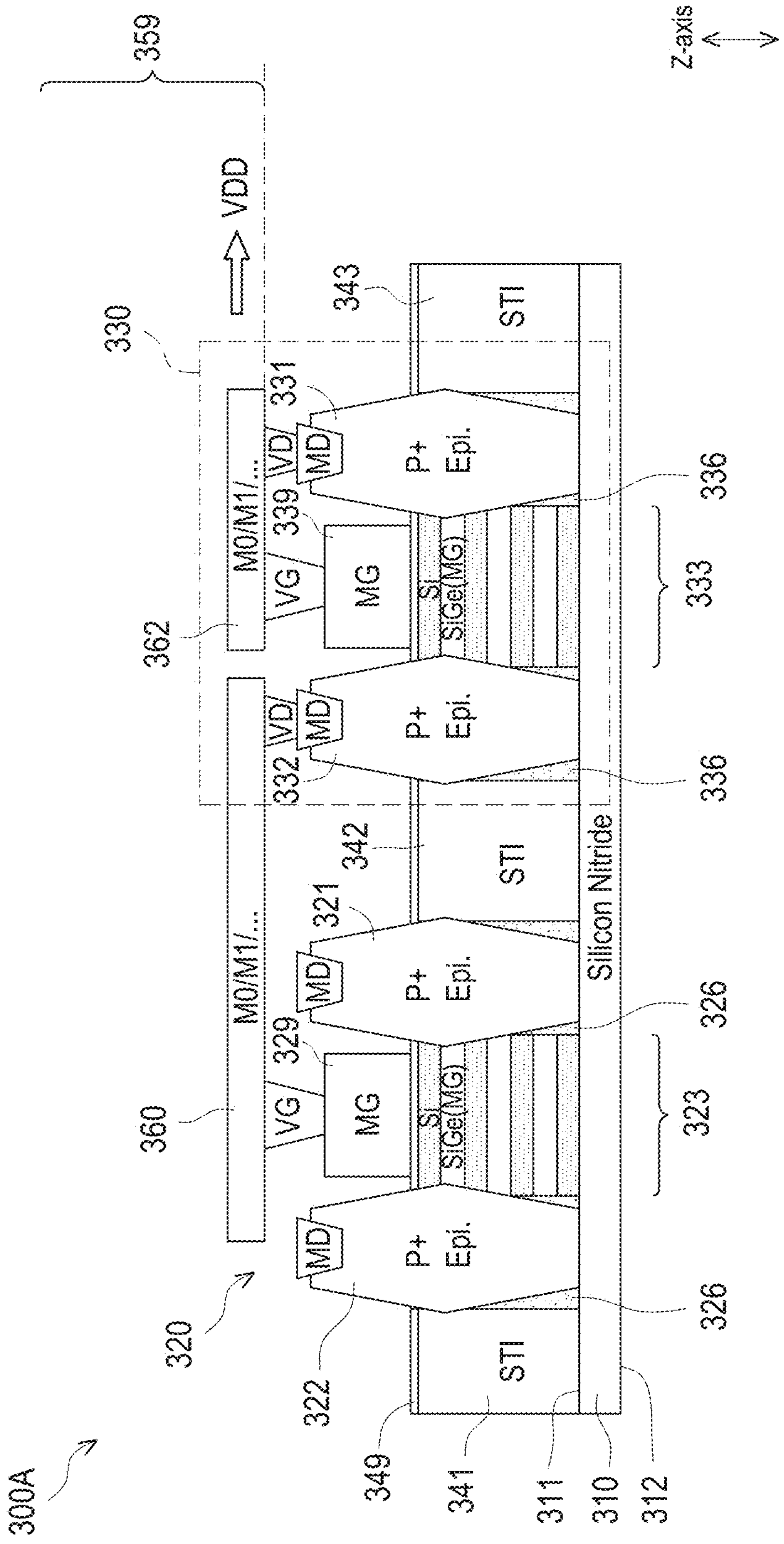
FIGS. 3A-3E are schematic cross-sectional views of various IC devices, in accordance with some embodiments.

FIG. 3A is a schematic cross-sectional view of an IC device 300A, in accordance with some embodiments. In some embodiments, the IC device 300A corresponds to the IC device 100. Components of the IC device 300A having corresponding components in the IC device 200A are designated by the reference numerals of the IC device 200A increased by one hundred.

The IC device 300A comprises an insulation layer 310, a front side 311, a back side 312, a to-be-protected device 320, an antenna PMOS 330, source/drain features 321, 322, 331, 332, channel regions 323, 333, gates 329, 339, doped wells 326, 336, STI regions 341, 342, 343, a liner layer 349, a redistribution structure 359, conductors 360, 362, which correspond to the insulation layer 210, front side 211, back side 212, to-be-protected device 220, antenna NMOS 230, source/drain features 221, 222, 231, 232, channel regions 223, 233, gates 229, 239, doped wells 226, 236, STI regions 241, 242, 243, liner layer 249, redistribution structure 259, conductors 260, 262 in the IC device 200A. Each of the to-be-protected device 320 and antenna PMOS 330 is a bulk-less device, as described herein. The source/drain features 321, 322, 331, 332 comprise P-type epitaxy structures.

The conductor 360, together with corresponding VG via, VD via, MD contact structure, electrically couples the gate 329 of the to-be-protected device 320 to the source/drain feature 332 of the antenna PMOS 330. The conductor 362, together with corresponding VG via, VD via, MD contact structure, electrically couples the gate 339 and the source/drain feature 331 of the antenna PMOS 330.

In some embodiments, the gate 329 of the to-be-protected device 320 corresponds to the gate G of one of the to-be-protected devices 120, the conductor 360 corresponds to the conductor 130, the source/drain feature 332, gate 339 and source/drain feature 331 of the antenna PMOS 330 correspond to the source/drain DP, gate GP and source/drain SP of the antenna PMOS MP, and the conductor 362 corresponds to the conductor 131. In at least one embodiment, the conductor 362 is configured to carry a reference voltage, e.g., the power supply voltage VDD, of the IC device 300A. For example, the conductor 362 comprises, or is electrically coupled to, a VDD power rail of the IC device 300A. In operation of the IC device 300A, the power supply voltage VDD is applied through the conductor 362 to the gate 339, and keeps the antenna PMOS 330 in the turned OFF state, thereby preventing the antenna PMOS 330 from affecting normal operations of various circuits and/or elements of the IC device 300A, including the to-be-protected device 320.

In some embodiments, the antenna PMOS 330 is configured to provide antenna effect protection for the gate dielectric of the to-be-protected device 320 in a manner similar to that described with respect to FIG. 1. For example, in response to a reversed bias, i.e., in response to a potential on the conductor 360 being lower than a potential on the conductor 362, the antenna PMOS 330 is configured to discharge negative electric charges on the conductor 360 to the conductor 362 by a leakage current of the antenna PMOS 330. In response to a forward bias, i.e., in response to the potential on the conductor 360 being higher than the potential on the conductor 362, the antenna PMOS 330 is configured to discharge positive electric charges on the conductor 360 to the conductor 362 by a channel current of the antenna PMOS 330. As a result, stress on the gate G of the to-be-protected device 320 due to accumulated positive or negative electric charges is relieved or avoided in one or more embodiments.

In some embodiments, the IC device 300A is the same as one of the IC devices 200A-200E, the insulation layer 310 is the same as the insulation layer 210, the redistribution structure 359 is the same as the redistribution structure 259, and a back side redistribution structure of the IC device 300A is the same as the back side redistribution structure of the one of the IC devices 200A-200E. In other words, in some embodiments, the configuration of PMOS transistors (e.g., to-be-protected devices, functional devices, and/or antenna PMOSs) as described with respect to FIG. 3A is included in the same IC device with the configuration of NMOS transistors (e.g., to-be-protected devices, functional devices, and/or antenna NMOSs) as described with respect to one of FIGS. 2A-2E.

Figure 3B:
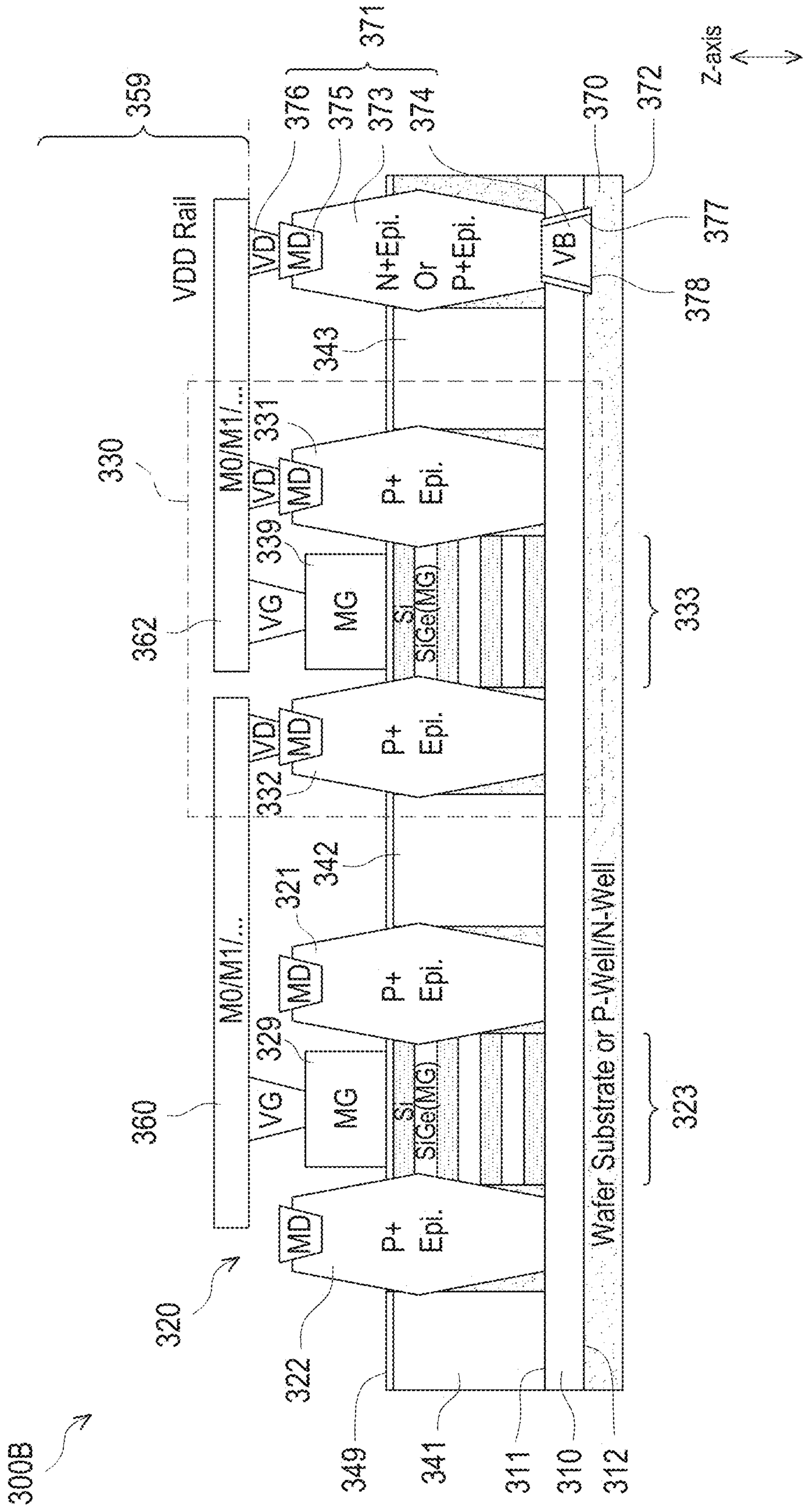

FIG. 3B is a schematic cross-sectional view of an IC device 300B, in accordance with some embodiments. In some embodiments, the IC device 300B corresponds to the IC device 100. For simplicity, corresponding components of the IC devices 300A, 300B are designated by the same reference numerals. Components of the IC device 300B having corresponding components in the IC device 200B are designated by the reference numerals of the IC device 200B increased by one hundred.

Compared to the IC device 300A, the IC device 300B further comprises a semiconductor layer 370 on the back side 312 of the insulation layer 310, and a conductive structure 371 extending through the insulation layer 310 and electrically coupling the conductor 362 on the front side 311 to the back side 312 of the insulation layer 310.

The semiconductor layer 370, the conductive structure 371, a back side 372, an epitaxy structure 373, an FTV 374, an MD contact structure 375, a VD via 376, and a liner layer 377 and a lower end 378 of the FTV 374 in the IC device 300B correspond to the semiconductor layer 270, conductive structure 271, back side 272, epitaxy structure 273, FTV 274, MD contact structure 275, VD via 276, and liner layer 277 and lower end 278 of the FTV 274 in the IC device 200B.

The semiconductor layer 370 comprises a wafer substrate, a P-well and/or an N-well. In some embodiments, the epitaxy structure 373 is configured and/or manufactured as a source/drain feature of an NMOS transistor, and comprises an N-type epitaxy structure. In some embodiments, the epitaxy structure 373 is configured and/or manufactured as a source/drain feature of a PMOS transistor, and comprises a P-type epitaxy structure. In some embodiments, the epitaxy structure 373 comprises a substrate tap or a well tap, located outside, and electrically isolated by the STI region 343 from, the source/drain features of transistors of the IC device 300B, such as the to-be-protected device 320 and the antenna PMOS 330. The substrate tap or well tap is electrically coupled to a VDD power rail configured by the conductor 362, which is configured to deliver the power supply voltage VDD to the corresponding substrate or well to prevent latch-up issues in operations of the IC device 300B. The power supply voltage VDD on the conductor 362 electrically coupled to the gate 339 keeps the antenna PMOS 330 in the turned OFF state, thereby preventing the antenna PMOS 330 from affecting normal operations of various circuits and/or elements of the IC device 300B. In one or more embodiments where substrate taps or well taps comprise tap structures other than epitaxy structures, the epitaxy structure 373 is omitted and replaced by the corresponding tap structure, e.g., a doped well. In a further example, a tap structure with the associated MD contact structure and VD via are omitted in a conductive structure which comprises an FTV extending all the way from the back side 312 of the insulation layer 310 to the conductor 362. In some embodiments, the IC device 300B further comprises a back side redistribution structure on the back side 372 of the semiconductor layer 370.

In at least one embodiment, the antenna PMOS 330 in the IC device 300B is configured to provide antenna effect protection for the to-be-protected device 320 in manners similar to those described with respect to FIG. 3A. In particular, negative or positive electric charges accumulated on the conductor 360 are discharged correspondingly by a leakage current or a channel current of the antenna PMOS 330 to the conductor 362. In at least one embodiment, one or more advantages described herein are achievable by the IC device 300B.

In some embodiments, the configuration of PMOS transistors (e.g., to-be-protected devices, functional devices, and/or antenna PMOSs) as described with respect to FIG. 3B is included in the same IC device with the configuration of NMOS transistors (e.g., to-be-protected devices, functional devices, and/or antenna NMOSs) as described with respect to one of FIGS. 2A-2E.

Figure 3C:
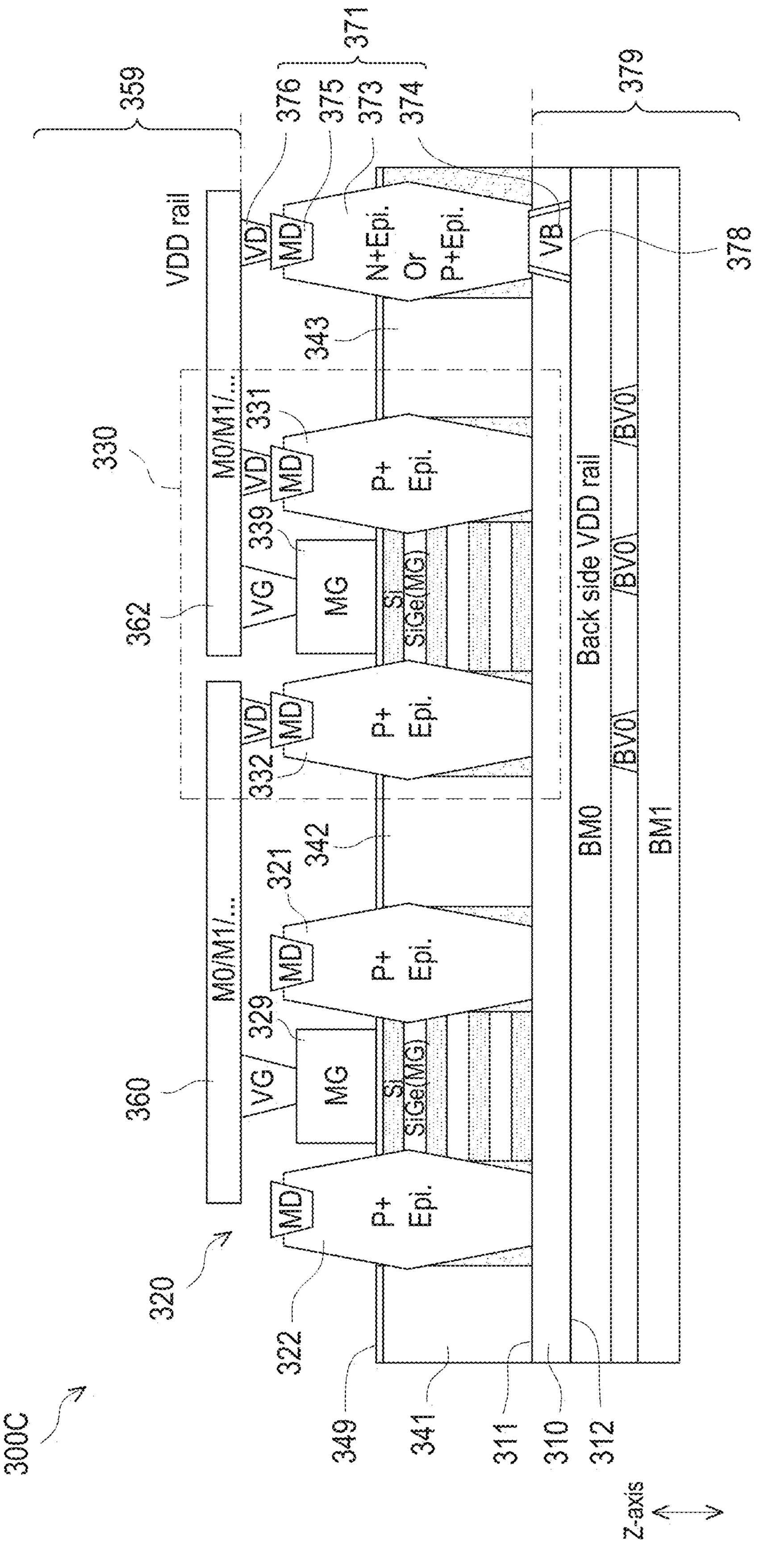

FIG. 3C is a schematic cross-sectional view of an IC device 300C, in accordance with some embodiments. In some embodiments, the IC device 300C corresponds to the IC device 100. For simplicity, corresponding components of the IC devices 300A-300C are designated by the same reference numerals. Components of the IC device 300C having corresponding components in the IC device 200C are designated by the reference numerals of the IC device 200C increased by one hundred.

Compared to the IC device 300B, the IC device 300C does not comprise the semiconductor layer 370. The IC device 300C comprises a back side redistribution structure 379 on the back side 312 of the insulation layer 310. The back side redistribution structure 379 of the IC device 300C corresponds to the back side redistribution structure 279 of the IC device 200C. The lower end 378 of the FTV 374 is flush with the back side 312 of the insulation layer 310. The BM0 layer is on the back side 312 of the insulation layer 310, and comprises a BM0 conductive pattern in electrical contact with the lower end 378 of the FTV 374. The BM0 conductive pattern is electrically coupled to, or comprises, a back side VDD power rail of a power delivery network configured in the back side redistribution structure 379. The power supply voltage VDD is delivered through the power delivery network in the back side redistribution structure 379, then through the conductive structure 371, to the conductor 362 which is a VDD power rail on the front side. In the IC device 300C, the epitaxy structure 373 is configured for both VDD power delivery from the back side to the front side, and as a substrate tap or well tap. The power supply voltage VDD delivered to the conductor 362 electrically coupled to the gate 339 keeps the antenna PMOS 330 in the turned OFF state, thereby preventing the antenna PMOS 330 from affecting normal operations of various circuits and/or elements of the IC device 300C.

In at least one embodiment, the antenna PMOS 330 in the IC device 300C is configured to provide antenna effect protection for the to-be-protected device 320 in manners similar to those described with respect to FIGS. 3A, 3B. In particular, negative or positive electric charges accumulated on the conductor 360 are discharged correspondingly by a leakage current or a channel current of the antenna PMOS 330 to the conductor 362. In at least one embodiment, one or more advantages described herein are achievable by the IC device 300C.

In some embodiments, the configuration of PMOS transistors (e.g., to-be-protected devices, functional devices, and/or antenna PMOSs) as described with respect to FIG. 3C is included in the same IC device with the configuration of NMOS transistors (e.g., to-be-protected devices, functional devices, and/or antenna NMOSs) as described with respect to one of FIGS. 2A-2E.

Figure 3D:
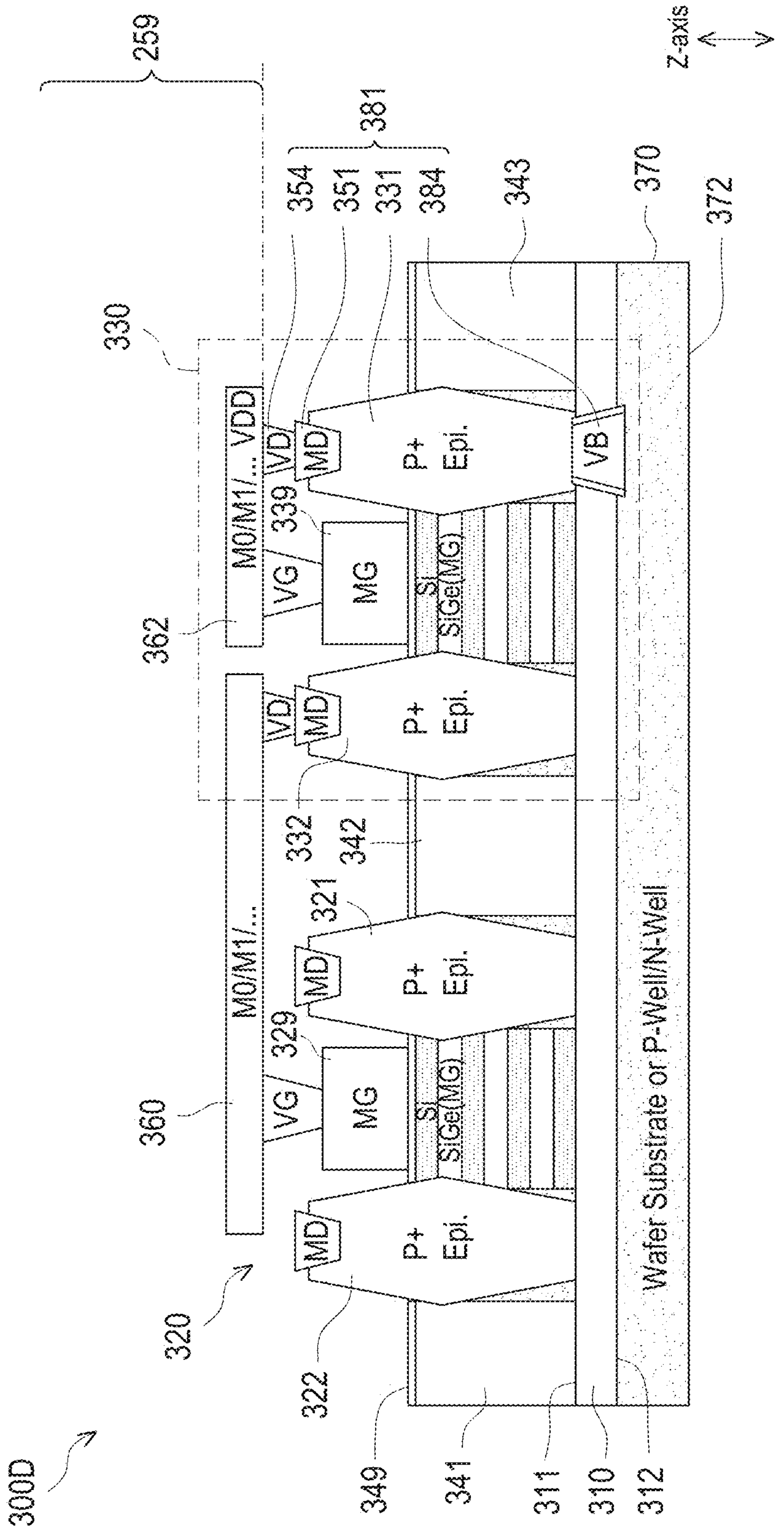

FIG. 3D is a schematic cross-sectional view of an IC device 300D, in accordance with some embodiments. In some embodiments, the IC device 300D corresponds to the IC device 100. For simplicity, corresponding components of the IC devices 300A-300D are designated by the same reference numerals. Components of the IC device 300D having corresponding components in the IC device 200D are designated by the reference numerals of the IC device 200D increased by one hundred.

Compared to the IC device 300B, the IC device 300D comprises a conductive structure 381 instead of the conductive structure 371. The conductive structure 381, an FTV 384, a MD contact structure 351 and a VD via 354 in the IC device 300D correspond to the conductive structure 271, FTV 284, MD contact structure 251 and VD via 254 in the IC device 200D. The conductive structure 381 in the IC device 300D is configured to electrically couple the conductor 362 from the front side to the back side, by using the source/drain feature 331 of the antenna PMOS 330, instead of a substrate tap or well tap configured by the epitaxy structure 373 outside the antenna PMOS 330 as in the IC device 300B. In some embodiments, the power supply voltage VDD is provided to the semiconductor layer 370 by another substrate tap or well tap (not shown), and is then delivered through the conductive structure 381 to the conductor 362. The power supply voltage VDD delivered to the conductor 362 electrically coupled to the gate 339 keeps the antenna PMOS 330 in the turned OFF state, thereby preventing the antenna PMOS 330 from affecting normal operations of various circuits and/or elements of the IC device 300D.

In at least one embodiment, the antenna PMOS 330 in the IC device 300D is configured to provide antenna effect protection for the to-be-protected device 320 in manners similar to those described with respect to FIGS. 3A-3C. In particular, negative or positive electric charges accumulated on the conductor 360 are discharged correspondingly by a leakage current or a channel current of the antenna PMOS 330 to the conductor 362. In at least one embodiment, one or more advantages described herein are achievable by the IC device 300D.

In some embodiments, the configuration of PMOS transistors (e.g., to-be-protected devices, functional devices, and/or antenna PMOSs) as described with respect to FIG. 3D is included in the same IC device with the configuration of NMOS transistors (e.g., to-be-protected devices, functional devices, and/or antenna NMOSs) as described with respect to one of FIGS. 2A-2E.

Figure 3E:
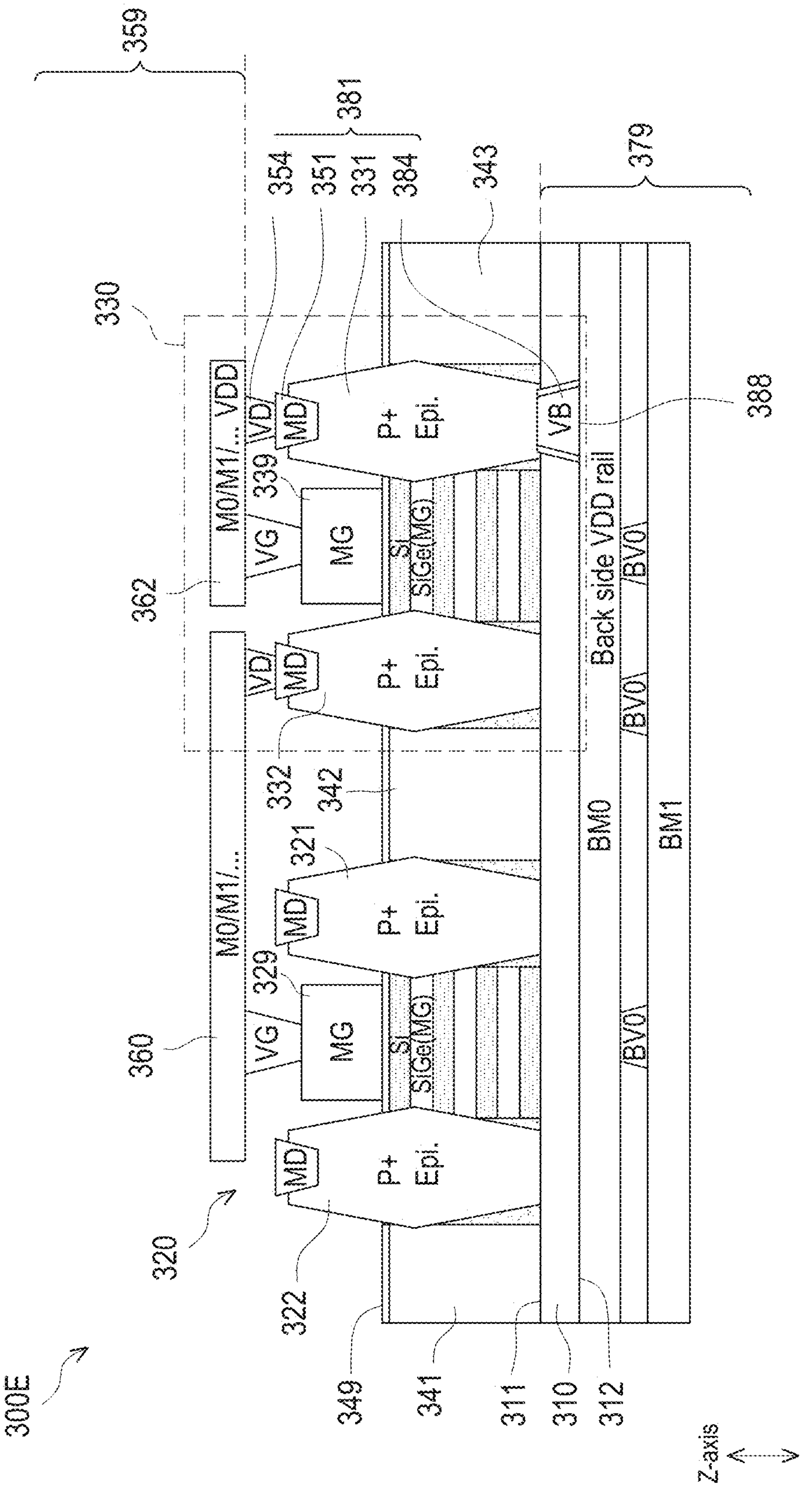

FIG. 3E is a schematic cross-sectional view of an IC device 300E, in accordance with some embodiments. In some embodiments, the IC device 300E corresponds to the IC device 100. For simplicity, corresponding components of the IC devices 300A-300E are designated by the same reference numerals. Components of the IC device 300E having corresponding components in the IC device 200E are designated by the reference numerals of the IC device 200E increased by one hundred.

Compared to the IC device 300D, the IC device 300E does not comprise the semiconductor layer 370. The IC device 300E comprises the back side redistribution structure 379 on the back side 312 of the insulation layer 310. A lower end 388 of the FTV 384 is flush with the back side 312 of the insulation layer 310. The BM0 layer is on the back side 312 of the insulation layer 310, and comprises a BM0 conductive pattern in electrical contact with the lower end 378 of the FTV 384. The BM0 conductive pattern is electrically coupled to, or comprises, a back side VDD power rail of a power delivery network configured in the back side redistribution structure 379. The power supply voltage VDD is delivered through the power delivery network in the back side redistribution structure 379, then through the conductive structure 381, to the conductor 362 which is a VDD power rail on the front side. The power supply voltage VDD is applied through the conductor 362 to the gate 339, and keeps the antenna PMOS 330 in the turned OFF state, thereby preventing the antenna PMOS 330 from affecting normal operations of various circuits and/or elements of the IC device 300E.

In at least one embodiment, the antenna PMOS 330 in the IC device 300E is configured to provide antenna effect protection for the to-be-protected device 320 in manners similar to those described with respect to FIGS. 3A-3D. In particular, negative or positive electric charges accumulated on the conductor 360 are discharged correspondingly by a leakage current or a channel current of the antenna PMOS 330 to the conductor 362. In at least one embodiment, one or more advantages described herein are achievable by the IC device 300E.

In some embodiments, the configuration of PMOS transistors (e.g., to-be-protected devices, functional devices, and/or antenna PMOSs) as described with respect to FIG. 3E is included in the same IC device with the configuration of NMOS transistors (e.g., to-be-protected devices, functional devices, and/or antenna NMOSs) as described with respect to one of FIGS. 2A-2E.

Figure 4:
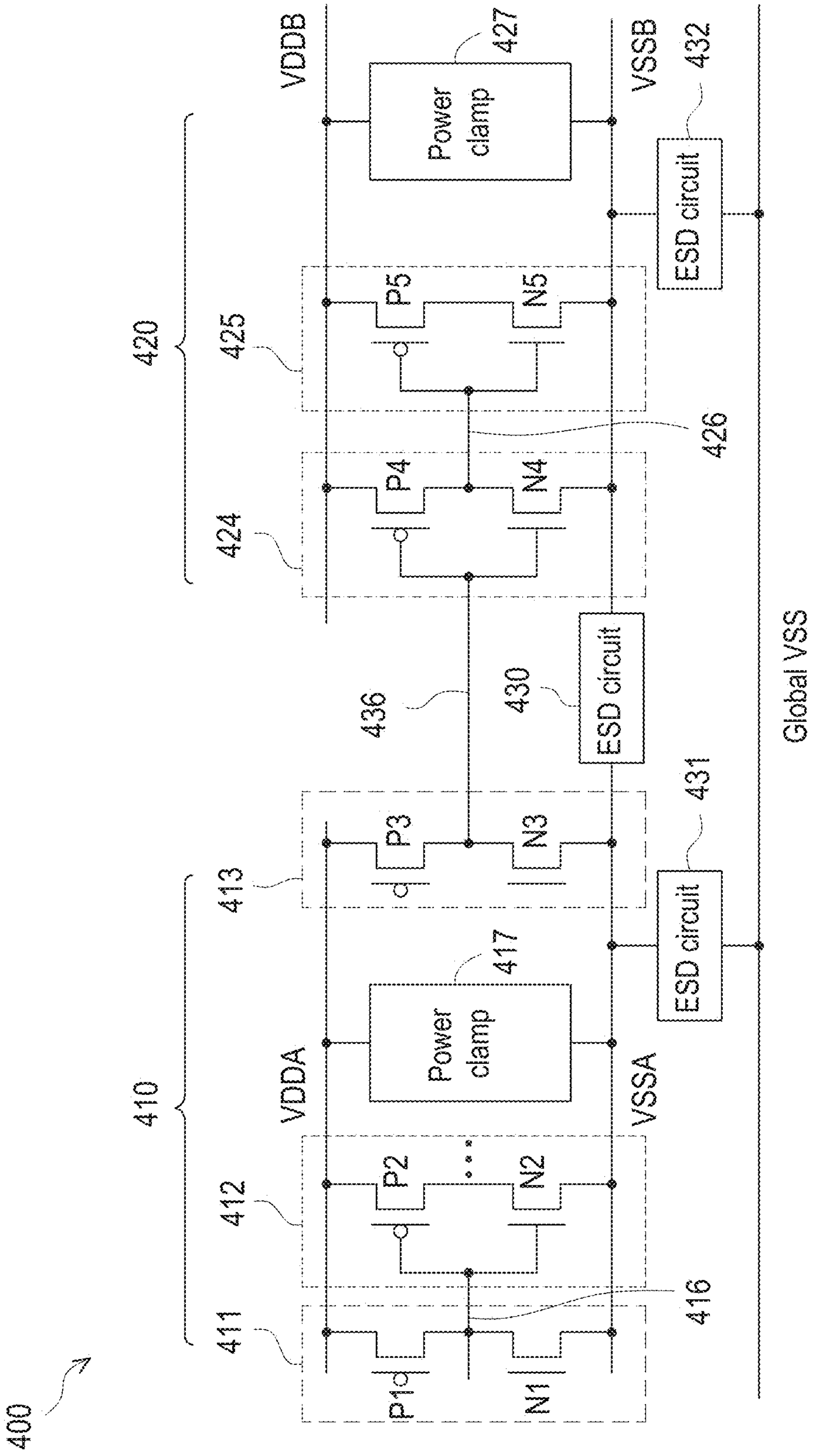
FIG. 4 is a schematic circuit diagram of an IC device, in accordance with some embodiments.

FIG. 4 is a schematic circuit diagram of an IC device 400, in accordance with some embodiments. In some embodiments, the IC device 400 corresponds to one or more of the IC devices 100, 200A-200E, 300A-300E.

The IC device 400 comprises a first power domain 410, a second power domain 420, a Global VSS power rail, and electrostatic discharge (ESD) circuits 430, 431, 432.

The first power domain 410 comprises a VDDA power rail configured to carry a power supply voltage VDDA, and a VSSA power rail configured to carry a ground voltage VSSA. The IC device 400 further comprises, in the first power domain 410, a plurality of devices electrically coupled to, and configured to be powered by, the VDDA power rail and VSSA power rail. In the example configuration in FIG. 4, representative devices of the IC device 400 in the first power domain 410 include PMOS transistors P1, P2, P3, and NMOS transistors N1, N2, N3.

The PMOS transistor P1 and NMOS transistor N1 are serially coupled between the VDDA power rail and VSSA power rail, and together configure an antenna effect protection circuit 411. In the example configuration in FIG. 4, gates of the PMOS transistor P1 and NMOS transistor N1 are floating. In some embodiments, the gate of the PMOS transistor P1 is electrically coupled to the VDDA power rail to configure the PMOS transistor P1 as a GDPMOS, and/or the gate of the NMOS transistor N1 is electrically coupled to the VSSA power rail to configure the NMOS transistor N1 as a GGNMOS. In at least one embodiment, either the PMOS transistor P1 or the NMOS transistor N1 is omitted.

The PMOS transistor P2 and NMOS transistor N2 are representative functional devices of a functional circuit 412. In the example configuration in FIG. 4, the PMOS transistor P2 and NMOS transistor N2 are coupled to form an inverter. This is an example. Other devices and/or circuits are included in the functional circuit 412 in one or more embodiments. In some embodiments, the IC device 400 comprises multiple functional circuits with various functionality in the first power domain 410. Gates of the PMOS transistor P2 and NMOS transistor N2 are electrically coupled by a conductor 416 to a source/drain of the PMOS transistor P1 and/or a source/drain of the NMOS transistor N2.

In some embodiments, the PMOS transistor P1 corresponds to the antenna PMOS MP, and/or the NMOS transistor N1 corresponds to the antenna NMOS MN, and/or the PMOS transistor P2 and NMOS transistor N2 correspond to PMOS transistors and NMOS transistors in the to-be-protected devices 120. In at least one embodiment, the PMOS transistor P1 and/or NMOS transistor N1 provide(s) antenna effect protection for the PMOS transistor P2 and NMOS transistor N2 as described with respect to one or more of FIGS. 1, 2A-2E, 3A-3E.

The PMOS transistor P3 and NMOS transistor N3 are serially coupled between the VDDA power rail and VSSA power rail, and together configure an antenna effect protection circuit 413. In the example configuration in FIG. 4, gates of the PMOS transistor P3 and NMOS transistor N3 are floating. In some embodiments, the gate of the PMOS transistor P3 is electrically coupled to the VDDA power rail to configure the PMOS transistor P3 as a GDPMOS, and/or the gate of the NMOS transistor N3 is electrically coupled to the VSSA power rail to configure the NMOS transistor N3 as a GGNMOS. In at least one embodiment, either the PMOS transistor P3 or the NMOS transistor N3 is omitted. The PMOS transistor P3 and/or NMOS transistor N3 is/are configured to provide cross-domain antenna effect protection as described herein.

The IC device 400 further comprises, in the first power domain 410, a power clamp circuit 417 electrically coupled between the VDDA power rail and VSSA power rail. The power clamp circuit 417 is a normally nonconductive device or circuit which is nonconductive, or turned OFF, during the normal operation of the IC device 400. Specifically, the power clamp circuit 417 is nonconductive when the voltage difference between the VDDA power rail and VSSA power rail is within a predetermined range, e.g., around a nominal voltage level of VDDA with VSSA having the ground voltage (e.g., zero). When the voltage difference across the power clamp circuit 417 is equal to or greater than a threshold voltage of the power clamp circuit 417, e.g., when an ESD event occurs, the power clamp circuit 417 is turned ON to conduct the current between the VDDA power rail and VSSA power rail, thereby protecting devices and/or circuits in the first power domain 410 from ESD-related damages.

The second power domain 420 comprises a VDDB power rail configured to carry a power supply voltage VDDB, and a VSSB power rail configured to carry a ground voltage VSSB. The IC device 400 further comprises, in the second power domain 420, a plurality of devices electrically coupled to, and configured to be powered by, the VDDB power rail and VSSB power rail. In the example configuration in FIG. 4, representative devices of the IC device 400 in the second power domain 420 include PMOS transistors P4, P5, and NMOS transistors N4, N5.

The PMOS transistor P4 and NMOS transistor N4 are serially coupled between the VDDB power rail and VSSB power rail, and together configure an antenna effect protection circuit 424. In at least one embodiment, either the PMOS transistor P4 or the NMOS transistor N4 is omitted.

The PMOS transistor P5 and NMOS transistor N5 are representative devices of a functional circuit 425. In the example configuration in FIG. 4, the PMOS transistor P5 and NMOS transistor N5 are coupled to form an inverter. This is an example. Other devices and/or circuits are included in the functional circuit 425 in one or more embodiments. In some embodiments, the IC device 400 comprises multiple functional circuits with various functionality in the second power domain 420. Gates of the PMOS transistor P5 and NMOS transistor N5 are electrically coupled by a conductor 426 to a source/drain of the PMOS transistor P4 and/or a source/drain of the NMOS transistor N5.

In some embodiments, the PMOS transistor P4 corresponds to the antenna PMOS MP, and/or the NMOS transistor N4 corresponds to the antenna NMOS MN, and/or the PMOS transistor P5 and NMOS transistor N5 correspond to PMOS transistors and NMOS transistors in the to-be-protected devices 120. In at least one embodiment, the PMOS transistor P4 and/or NMOS transistor N4 provide(s) antenna effect protection for the PMOS transistor P5 and NMOS transistor N5 as described with respect to one or more of FIGS. 1, 2A-2E, 3A-3E. In at least one embodiment, the PMOS transistor P5 and NMOS transistor N5 are protected from the antenna effect by the PMOS transistor P4 and/or NMOS transistor N4, regardless of whether the PMOS transistor P4 and/or NMOS transistor N4 is/are in the ON or OFF state.

The PMOS transistor P4 and NMOS transistor N4 are also devices to be protected by the antenna effect protection circuit 413. Specifically, gates of the PMOS transistor P4 and NMOS transistor N4 are electrically coupled by a conductor 436 to a source/drain of the PMOS transistor P3 and/or a source/drain of the NMOS transistor N3. In some embodiments, the PMOS transistor P3 and/or NMOS transistor N3 in the first power domain 410 provide(s) antenna effect protection for the PMOS transistor P4 and NMOS transistor N4 in the second power domain 420 in a manner similar to that described with respect to one or more of FIGS. 1, 2A-2E, 3A-3E. This is an example of cross-domain antenna effect protection in accordance with some embodiments. In some embodiments, the PMOS transistor P3 and/or NMOS transistor N3 in the first power domain 410 is/are coupled by a conductor similar to the conductor 436 to a source/drain of the PMOS transistor P5 and/or a source/drain of the NMOS transistor N5, thereby providing antenna effect protection for the PMOS transistor P5 and/or NMOS transistor N5 in the second power domain 420 in a manner similar to that described with respect to one or more of FIGS. 1, 2A-2E, 3A-3E. This is a further example of cross-domain antenna effect protection in accordance with some embodiments.

In some embodiments, one or more of the transistors P1-P5, N1-N5 are bulk-less devices.

The IC device 400 further comprises, in the second power domain 420, a power clamp circuit 427 electrically coupled between the VDDB power rail and VSSB power rail. In at least one embodiment, the power clamp circuit 427 is configured and/or functions in similar manners to those described with respect to the power clamp circuit 417.

The ESD circuit 430 is electrically coupled between the VSSA power rail of the first power domain 410 and the VSSB power rail of the second power domain 420. The ESD circuit 431 is electrically coupled between the VSSA power rail and the Global VSS power rail. The ESD circuit 432 is electrically coupled between the VSSB power rail and the Global VSS power rail. The ESD circuits 430-432 are configured to provide protection against ESD events. Examples of ESD circuits include, but are not limited to, a diode, a power clamp, a snapback device having parasitic NPN BJT, a snapback MOS device, a field oxide device (FOD), a silicon-controlled-rectifier (SCR), or the like. In some embodiments, one or more of the ESD circuits 430-432 comprise a substrate tap, an FTV, or the like.

In some embodiments, the VSSA power rail and the VSSB power rail are local VSS power rails for the corresponding power domains 410, 420. In at least one embodiment, the VSSA power rail and VSSB power rail are located on a front side of the IC device 400 in a manner similar to that described with respect to FIGS. 2A-2E, 3A-3E. In some embodiments, the Global VSS power rail is configured for full-chip integration usage of the whole IC device 400. In at least one embodiment, the Global VSS power rail is fabricated on the front side, e.g., in a SOI process. In at least one embodiment, the Global VSS power rail is fabricated on the back side, e.g., in an SPR process. In some embodiments, the Global VSS power rail on the back side is electrically coupled to the VSSA power rail and VSSB power rail on the front side by one or more FTVs and/or substrate taps. In some embodiments, the IC device 400 comprises one or more footer circuits (not shown) configured to controllably connect/disconnect the Global VSS power rail to/from the VSSA power rail and the VSSB power rail, such that each of the local VSS power rails, i.e., VSSA power rail and VSSB power rail, is controllably connected/disconnected to/from the Global VSS power rail independently from the other local VSS power rail.

In some embodiments, the VDDA power rail and the VDDB power rail are local VDD power rails for the corresponding power domains 410, 420. In at least one embodiment, the VDDA power rail and the VDDB power rail are located on a front side of the IC device 400. In some embodiments, the IC device 400 further comprises a Global VDD power rail (not shown) which is configured for full-chip integration usage of the whole IC device 400. In at least one embodiment, the Global VDD power rail is fabricated on the front side, e.g., in a SOI process. In at least one embodiment, the Global VDD power rail is fabricated on the back side, e.g., in an SPR process. In some embodiments, the Global VDD power rail on the back side is electrically coupled to the VDDA power rail and VDDB power rail on the front side by one or more FTVs and/or substrate taps. In some embodiments, the IC device 400 comprises one or more header circuits (not shown) configured to controllably connect/disconnect the Global VDD power rail to/from the VDDA power rail and the VDDB power rail, such that each of the local VDD power rails, i.e., VDDA power rail and VDDB power rail, is controllably connected/disconnected to/from the Global VDD power rail independently from the other local VDD power rail. In some embodiments, the voltage level of VDDA is the same as the voltage level of VDDB. In at least one embodiment, the voltage level of VDDA is different from the voltage level of VDDB. In at least one embodiment, one or more advantages described herein are achievable by the IC device 400. In one or more embodiments, the IC device 400 further makes it possible to configure an antenna effect protection circuit or device to provide antenna effect protection for one or more devices in the same power domain, and/or for one or more devices in a different power domain.

FIGS. 5A-5H are schematic cross-sectional views of one or more IC devices at various stages in manufacturing processes, in accordance with some embodiments. In at least one embodiment, one or more manufacturing processes described with respect to FIGS. 5A-5H are applicable to fabricate one or more of the IC devices described herein with respect to FIGS. 2A-2E, 3A-3E. In FIGS. 5A-5H, manufacturing processes for fabricating N-type devices or transistors are described. P-type devices or transistors are fabricated in similar manners. For simplicity, corresponding components in FIGS. 2A-2E and in FIGS. 5A-5H are designated by the same reference numerals.

Figure 5A:
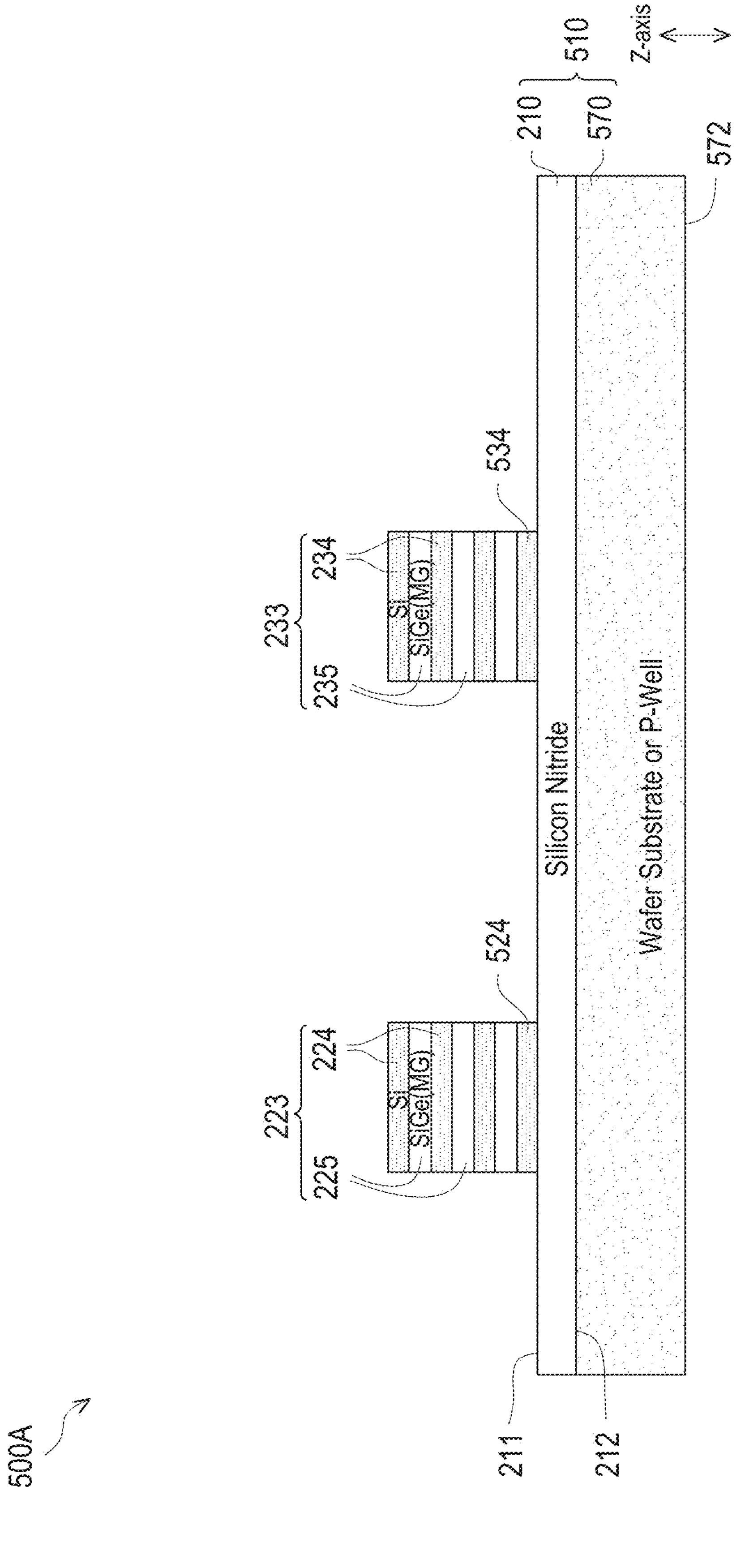
FIGS. 5A-5H are schematic cross-sectional views of one or more IC devices at various stages in manufacturing processes, in accordance with some embodiments.

In FIG. 5A, an example manufacturing process starts from a SOI substrate 510. The SOI substrate 510 comprises a semiconductor substrate 570, and the insulation layer 210 over the semiconductor substrate 570. The semiconductor substrate 570 has a front side in contact with the back side 212 of the insulation layer 210, and a back side 572. In some embodiments, the SOI substrate 510 further comprises a front side semiconductor layer, e.g., a Si layer, over the insulation layer 210. This front side semiconductor layer is later patterned to become lowest layers 524, 534 of corresponding multilayer stacks in the channel regions 223, 233, as described herein. In at least one embodiment, the SOI substrate 510 having the insulation layer 210 buried between the semiconductor substrate 570 and the front side semiconductor layer is manufactured using one or more SOI processes. Examples of SOI processes include, but are not limited to, separation by implanted oxygen (SIMOX), wafer bonding followed by precision grinding and polishing, ion split including implantation of hydrogen to form a weakened region within a silicon wafer, or the like. Other SOI processes are within the scopes of various embodiments.

In some embodiments, the semiconductor substrate 570 is a p-type substrate. In some embodiments, substrate 570 is an n-type substrate. In some embodiments, substrate 570 includes an elemental semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the semiconductor substrate 570 includes a doped epitaxial layer or a buried layer. In some embodiments, the compound semiconductor substrate has a multilayer structure, or the substrate includes a multilayer compound semiconductor structure.

In some embodiments, the insulation layer 210 comprises a non-conducting material, such as an oxide or a nitride. In at least one embodiment, the insulation layer 210 comprises a silicon nitride. Other non-conductive materials of the insulation layer 210, such as SiO, $SiO_2$, combinations thereof, or the like, are within the scopes of various embodiments. The described usage of the SOI substrate 510 where the insulation layer 210 exists at the beginning of the manufacturing process is an example. Other approaches where the insulation layer 210 is formed later, e.g., after wafer thinning and oxide regrowth, are within the scopes of various embodiments, as described herein.

Alternating layers of a first semiconductor material and a second semiconductor material different from the first semiconductor material are sequentially deposited over the insulation layer 210. In some embodiments, the first semiconductor material comprises silicon, and the second semiconductor material comprises SiGe. As a result, alternating SiGe/Si/SiGe/Si layers are stacked over the front side 211 of the insulation layer 210. In some embodiments, the alternating layers SiGe/Si/SiGe/Si are formed by an epitaxy process. Other materials and/or manufacturing processes for the alternating layers of the different first and second semiconductor materials are within the scopes of various embodiments.

In some embodiments, dummy gate structures (not shown) are formed over the alternating layers SiGe/Si/SiGe/Si, to be used as a mask for subsequent patterning, and for later formation of a metal gate. In an example, each dummy gate structure includes various dummy layers, such as a dummy gate electrode (e.g., polysilicon), a hard mask layer (e.g., SiN, SiCN, SiO, or the like). The dummy gate structures are formed by deposition processes, lithography processes, etching processes, combinations thereof, or the like.

The alternating layers SiGe/Si/SiGe/Si are patterned by using the dummy gate structures as a mask, to obtain the channel region 223 having a multilayer stack of alternating layers 224, 225, and the channel region 233 having a multilayer stack of alternating layers 234, 235. The layers 224 and 234 are patterned parts of the Si layers, and the layers 225 and 235 are patterned parts of the SiGe layers. A resulting structure 500A is thus obtained.

Figure 5B:
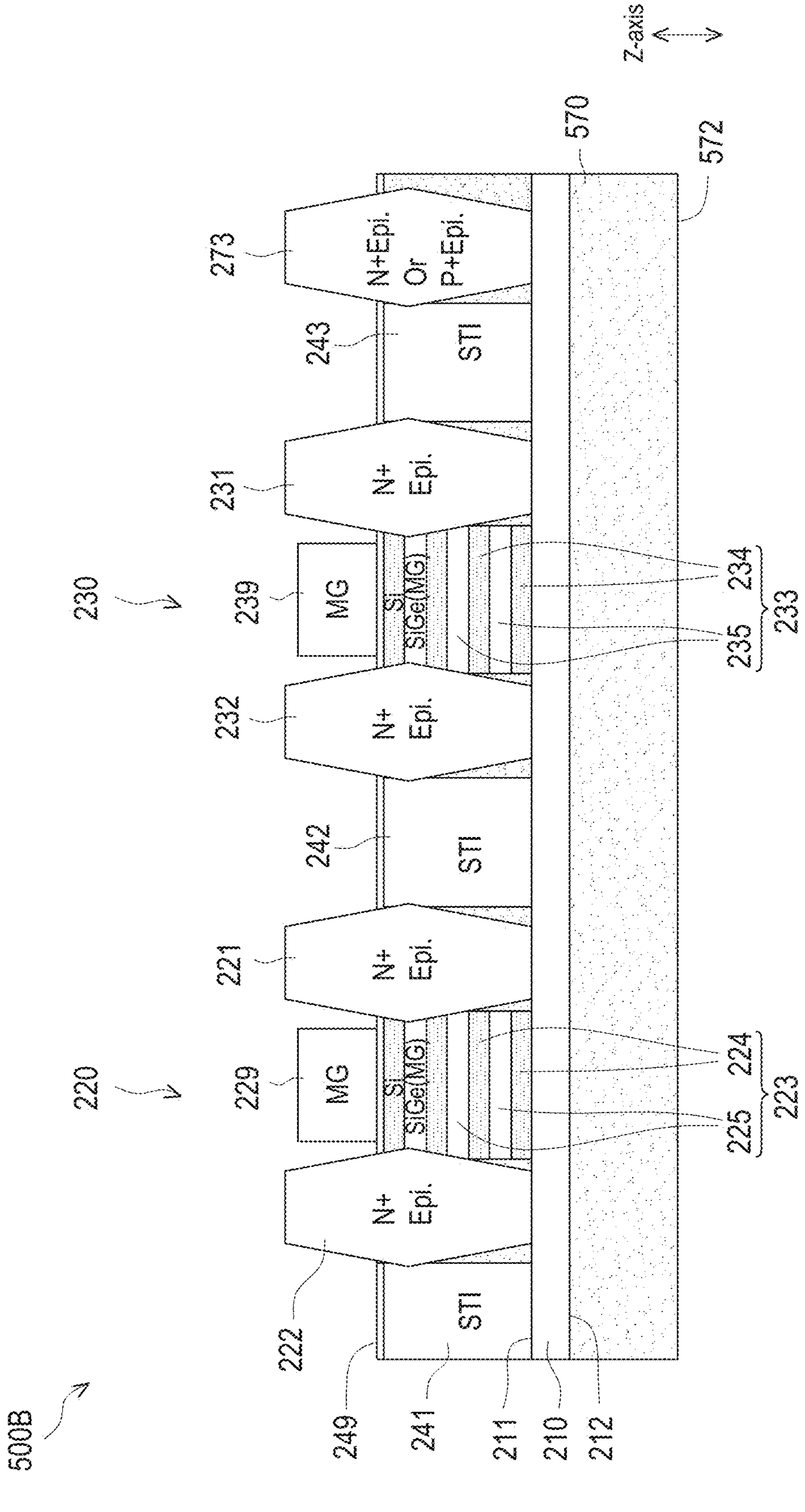

In FIG. 5B, various devices and tap structures are fabricated based on the structure 500A. In at least one embodiment, the STI regions 241-243 are formed in trenches between the channel regions 223, 233 to separate and electrically isolate active regions of the devices to be manufactured. In some embodiments, one or more dielectric materials, such as SiO and/or SiN, are deposited over the structure 500A, e.g., by chemical vapor deposition (CVD), plasma enhanced CVD (PECVD), atomic layer deposition (ALD), physical vapor deposition (PVD), thermal oxidation, or the like. Subsequently, the dielectric material is recessed, e.g., by etching and/or chemical mechanical polishing (CMP) to form the STI regions 241-243.

In some embodiments, the liner layer 249 is formed over the STI regions 241-243, and the multilayer stacks in the channel regions 223, 233. In some embodiment, the liner layer 249 includes a dielectric material, such as SiO, SiN, or the like, and is formed by a deposition process, such as CVD, PVD, ALD or the like. In some embodiments, the liner layer 249 is omitted.

In some embodiments, SiGe at exposed edges of the layers 225, 235 are selectively removed (not shown for simplicity) by an etching process to form gaps between edges of adjacent layers 224, 234. In some embodiments, the selective removal of SiGe at the exposed edges of the layers 225, 235 include an oxidation process followed by a selective etching.

In some embodiments, source/drain features 221, 222, 231, 232 and tap structure 273 are epitaxially grown as epitaxy structures. The source/drain features 221, 222, 231, 232 are grown to be in contact with the exposed edges of the Si layers 224, 234. The tap structure 273 is grown to be isolated from the source/drain features. Example epitaxy processes include, but are not limited to, CVD deposition, ultra-high vacuum CVD (UHV-CVD), low-pressure CVD (LPCVD), plasma-enhanced CVD (PECVD), selective epitaxial growth (SEG) or the like.

In some embodiments, a metal gate replacement process is performed to replace the dummy gate structures with metal gate structures, to obtain devices such as the to-be-protected device 220, and antenna NMOS 230. In some embodiments, the dummy gate structures are removed by one or more etching processes, such as wet etching, dry etching, or the like. The layers 224, 225, 234, 235 are exposed as a result. SiGe in the layers 225, 235 is selectively removed by a selective oxidation/etching process similar as that used to remove SiGe at the exposed edges of the layers 225, 235. The layers 224, 234 remain in the corresponding channel regions 223, 233, and configure nanosheets for the corresponding devices. Metal gate structures are formed in the channel regions 223, 233 to wrap around the layers 224, 234. In some embodiments, each metal gate structure includes a gate dielectric (not shown) wrapping around the layers 224, 234, and a metal gate 229, 239 over the gate dielectric. Example materials of the gate dielectric includes a high-k dielectric material, such as HfO2, HfSiO, HfSiO4, HfSiON, HfLaO, HfTaO, HfTiO, HfZrO, HfAlOx, ZrO, ZrO2, ZrSiO2, AlO, AlSiO, Al2O3, TiO, TiO2, LaO, LaSiO, Ta2O3, Ta2O5, Y2O3, SrTiO3, BaZrO, BaTiO3 (BTO), (Ba,Sr)TiO3 (BST), Si3N4, hafnium dioxide-alumina (HfO2-Al2O3) alloy, or the like. In some embodiments, the gate dielectric is deposited by CVD, PVD, ALD, or the like. In some embodiments, each metal gate 229, 239 includes one or more metals such as Al, Cu, W, Ti, Ta, TiN, TaN, NiSi, CoSi, and is formed by, e.g., CVD, ALD, PVD, plating, chemical oxidation, thermal oxidation, or the like. A resulting structure 500B with the to-be-protected device 220 and antenna NMOS 230 is thus obtained. Because the to-be-protected device 220 and antenna NMOS 230 are formed over the insulation layer 210, they are bulk-less devices.

Figure 5C:
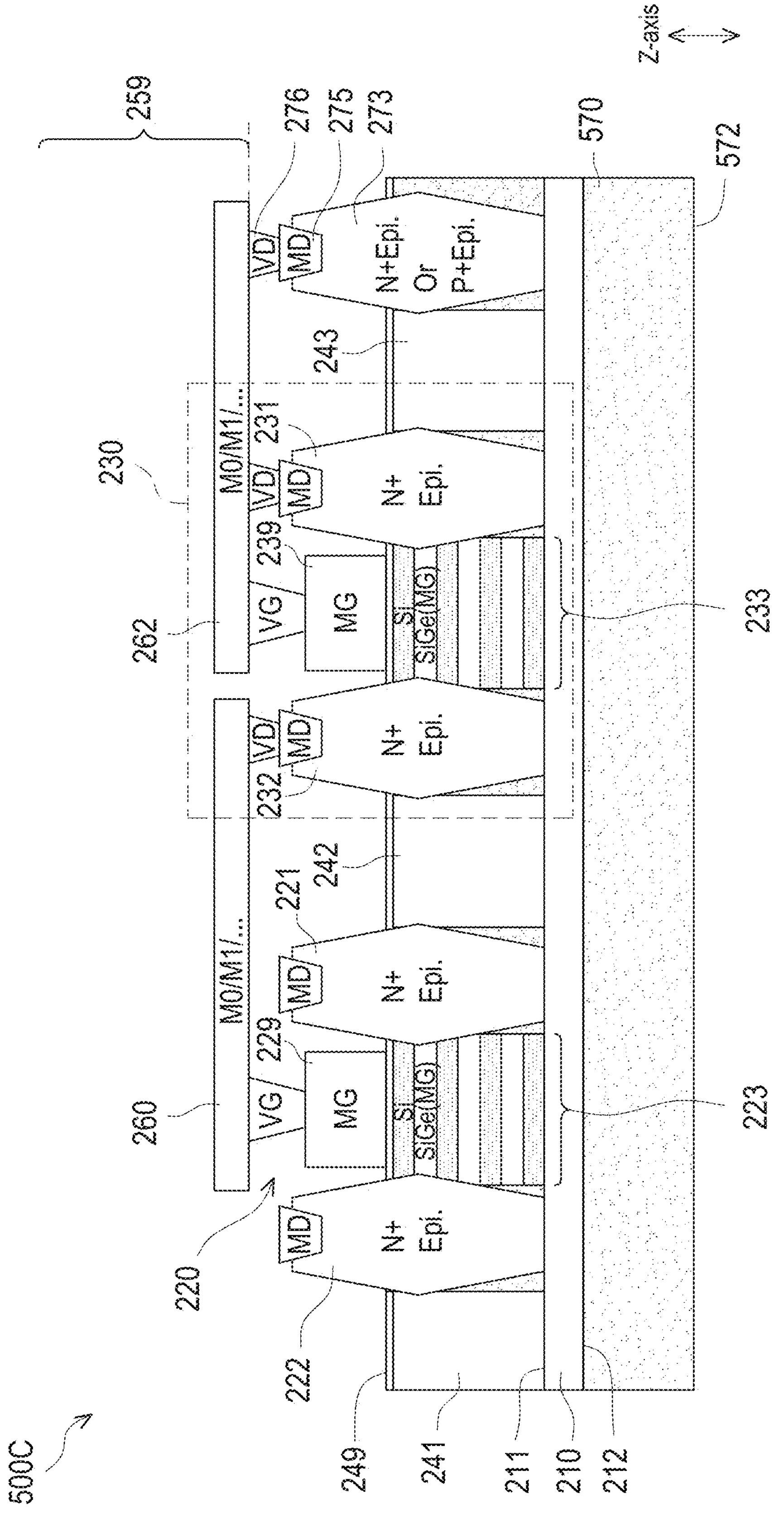

In FIG. 5C, various MD contact structures, VD vias, VG vias, as well as metal layers and via layers of a redistribution structure 259 are formed over the structure 500B to couple functional devices, e.g., the to-be-protected device 220, or the like, into one or more functional circuits of the IC device being manufactured. The antenna NMOS 230 is also coupled to the to-be-protected device 220 in this process, which includes a combination of photolithography, material removal and deposition processes. Examples of the material removal process include, but are not limited to, wet etching, dry etching, laser drilling, or the like, or another suitable etching process. The openings created by the material removal process are then filled with a conductive material, e.g., copper, aluminum, titanium, nickel, tungsten, or the like, by using CVD, PVD, sputtering, ALD, or the like. A resulting structure 500C is thus obtained.

In some embodiments, while various contact structures, vias, conductive patterns are formed to build the redistribution structure 259 on the front side, there is a possibility that negative or positive electric charges are accumulated on the conductor 260. The accumulated electric charges are discharged by the antenna NMOS 230 to the conductor 262, thereby protecting the gate dielectric of the to-be-protected device 220 from damages due to the accumulated electric charges.

Figure 5D:
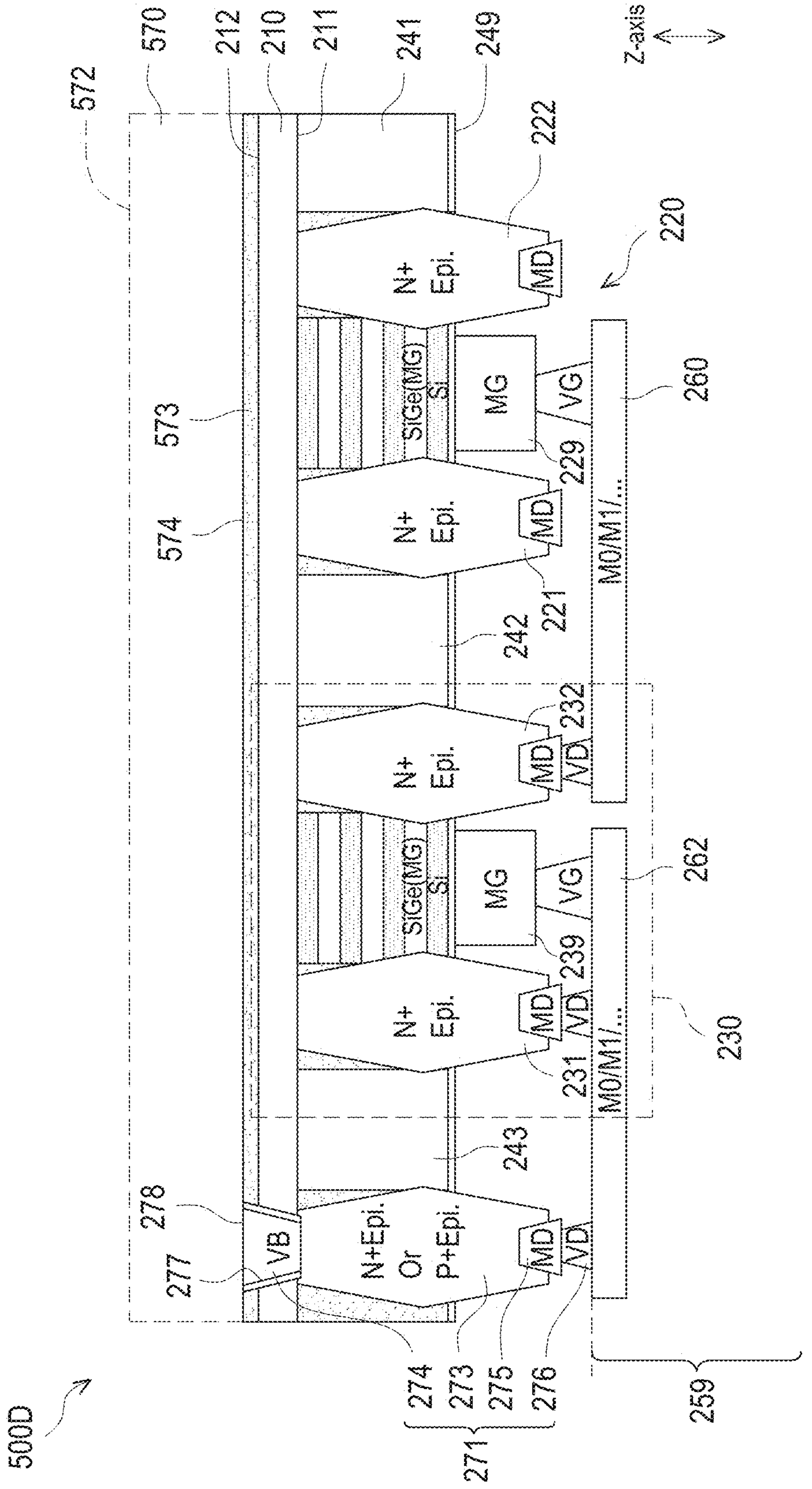

In FIG. 5D, the structure 500C is flipped upside down and temporarily bonded to a carrier (not shown). Wafer thinning is performed from the back side 572 to remove a portion of the semiconductor substrate 570. In some embodiments, the wafer thinning process includes a grinding operation, a polishing operation (such as, chemical mechanical polishing (CMP)), or the like. In the example configuration in FIG. 5D, the wafer thinning process is stopped with a semiconductor layer 573, which is a portion of the semiconductor substrate 570, remaining on the insulation layer 210. The semiconductor layer 573 has a back side 574.

A via hole is formed, e.g., by etching, from the back side 574 of the semiconductor layer 573, to extend through the semiconductor layer 573 and the insulation layer 210, and to expose the tap structure 273. A dielectric material is deposited over the sidewall of the via hole to form the liner 277. A conductive material, e.g., a metal, is filled in the via hole to obtain the FTV 274. A planarization process (such as CMP) is performed. As a result, the end 278 of the FTV 274 becomes flush with the back side 574 of the semiconductor layer 573, and a resulting structure 500D is thus obtained. In at least one embodiment, the structure 500D corresponds to the IC device 200B.

The FTV 274, together with the tap structure 273, MD contact structure 275, VD vias 276, configures the conductive structure 271 that electrically couples the conductor 262 to the back side. In some embodiments, a back side redistribution structure (not shown) is formed over the back side 574 of the semiconductor layer 573. The back side redistribution structure comprises a power rail, e.g., a VSS power rail, electrically coupled to the end 278 of the FTV 274, to configure the tap structure 273 as a substrate tap or well tap. The conductive structure 271 is further configured to provide VSS to the gate 239 of the antenna NMOS 230, to turn OFF the antenna NMOS 230 during operations of the IC device being manufactured. As result, the antenna NMOS 230 does not affect functionality of the IC device during normal operation.

Figure 5E:
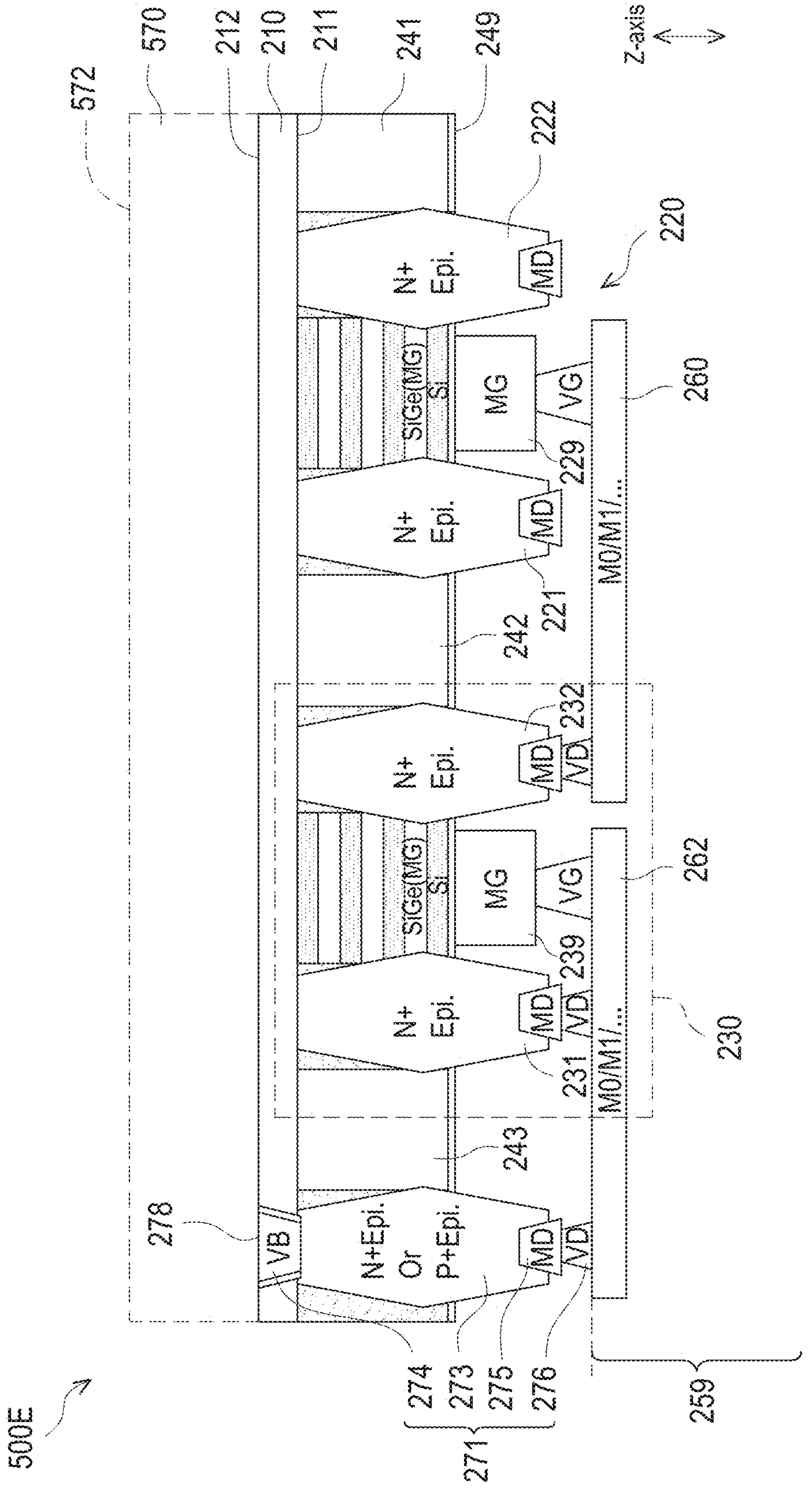

In FIG. 5E, an alternative process to that described with respect to FIG. 5D is performed. Similarly to the process described with respect to FIG. 5D, in FIG. 5E, the structure 500C is flipped upside down and temporarily bonded to a carrier (not shown), and wafer thinning is performed from the back side 572 of the semiconductor substrate 570. A difference from the process described with respect to FIG. 5D is that, in FIG. 5E, the semiconductor substrate 570 is completely removed. The FTV 274 is formed through the insulation layer 210 to be in electric contact with the tap structure 273, and has the end 278 flush with the back side 212 of the insulation layer 210. A resulting structure 500E is thus obtained. In some embodiments, where the conductive structure 271 is omitted, the structure 500E corresponds to the IC device 200A.

Figure 5F:
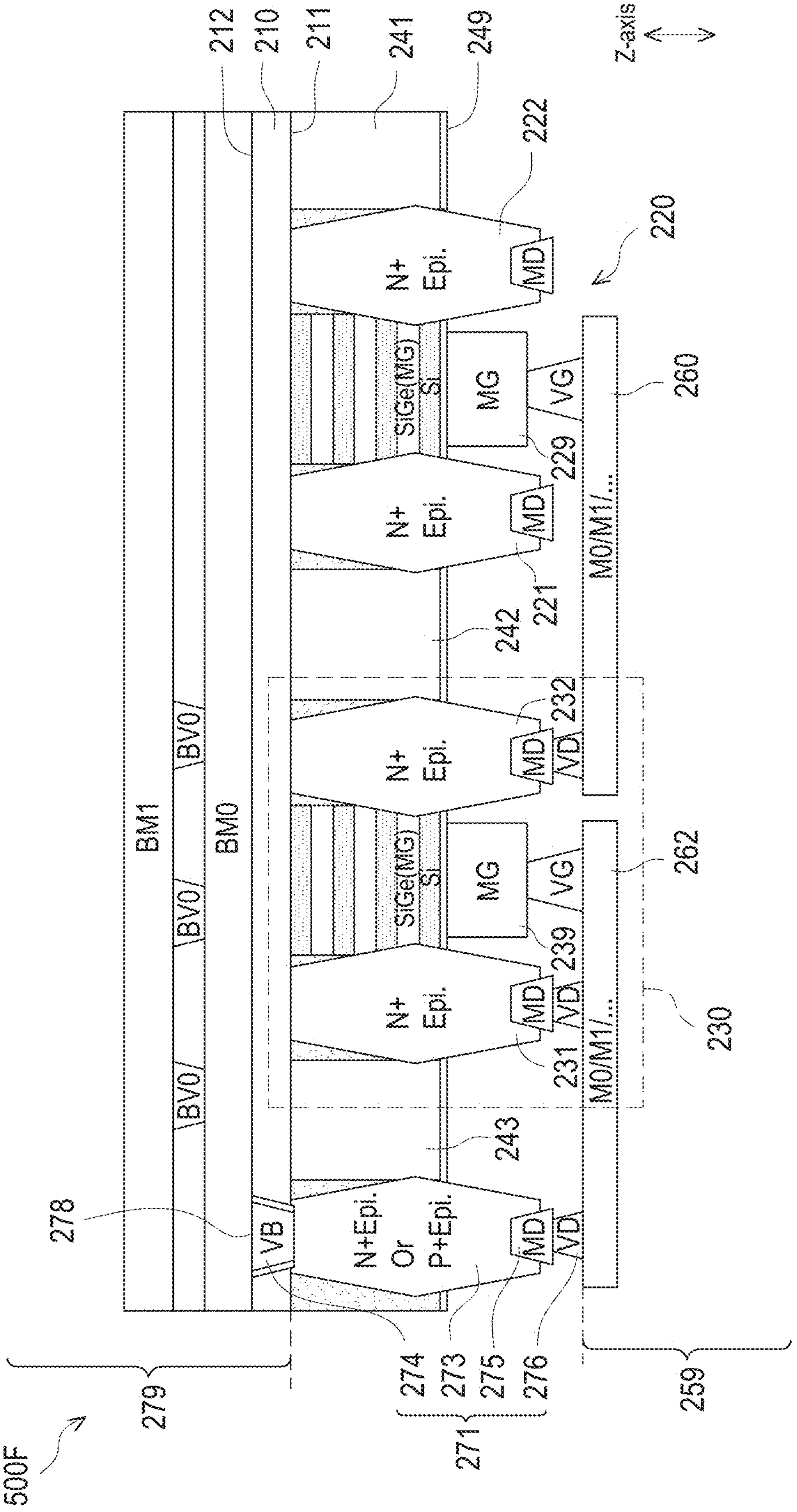

In FIG. 5F, a back side redistribution structure 279 is formed over the back side 212 of the insulation layer 210. A resulting structure 500F is thus obtained. The back side redistribution structure comprises a power rail, e.g., a VSS power rail, electrically coupled to the end 278 of the FTV 274, to configure the tap structure 273 as a substrate tap or well tap. The conductive structure 271 is further configured to provide VSS to the gate 239 of the antenna NMOS 230, to turn OFF the antenna NMOS 230 during operations of the IC device being manufactured. As result, the antenna NMOS 230 does not affect functionality of the IC device during normal operation. In some embodiments, the structure 500F corresponds to the IC device 200C.

Figure 5G:
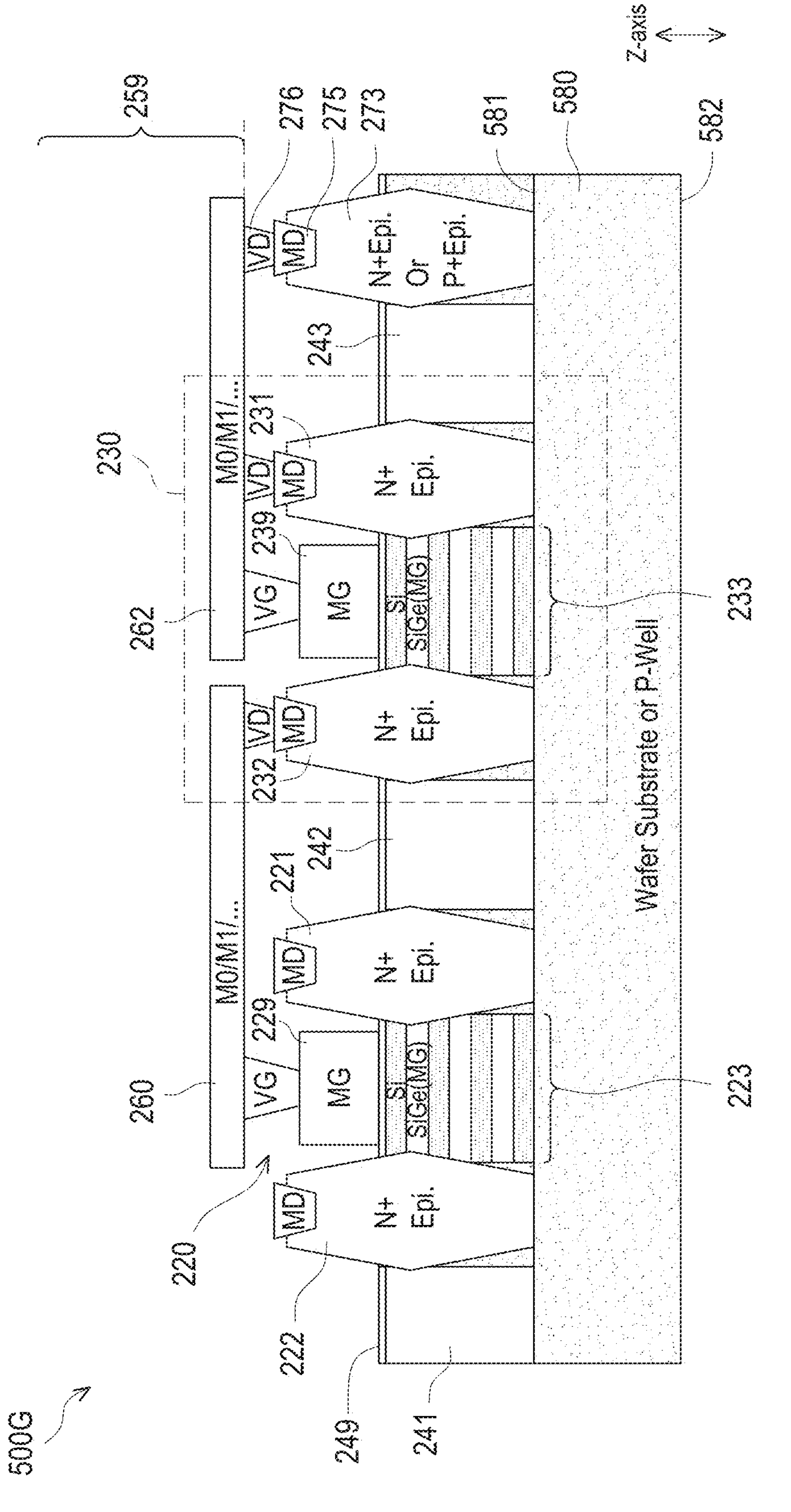

In FIG. 5G, an alternative process to that described with respect to FIGS. 5A-5C is performed. A difference from the process described with respect to FIGS. 5A-5C is that, in FIG. 5G, devices and the redistribution structure 259 of the IC device being manufactured are formed not over a SOI substrate, but over a semiconductor substrate 580. The semiconductor substrate 580 comprises a front side 581 over which the devices and the redistribution structure 259 of the IC device are formed, and a back side 582. In some embodiments, except for the usage of the semiconductor substrate 580 instead of a SOI substrate, processes in FIG. 5G are similar to those described with respect to FIGS. 5A-5C. A resulting structure 500G is thus obtained.

Figure 5H:
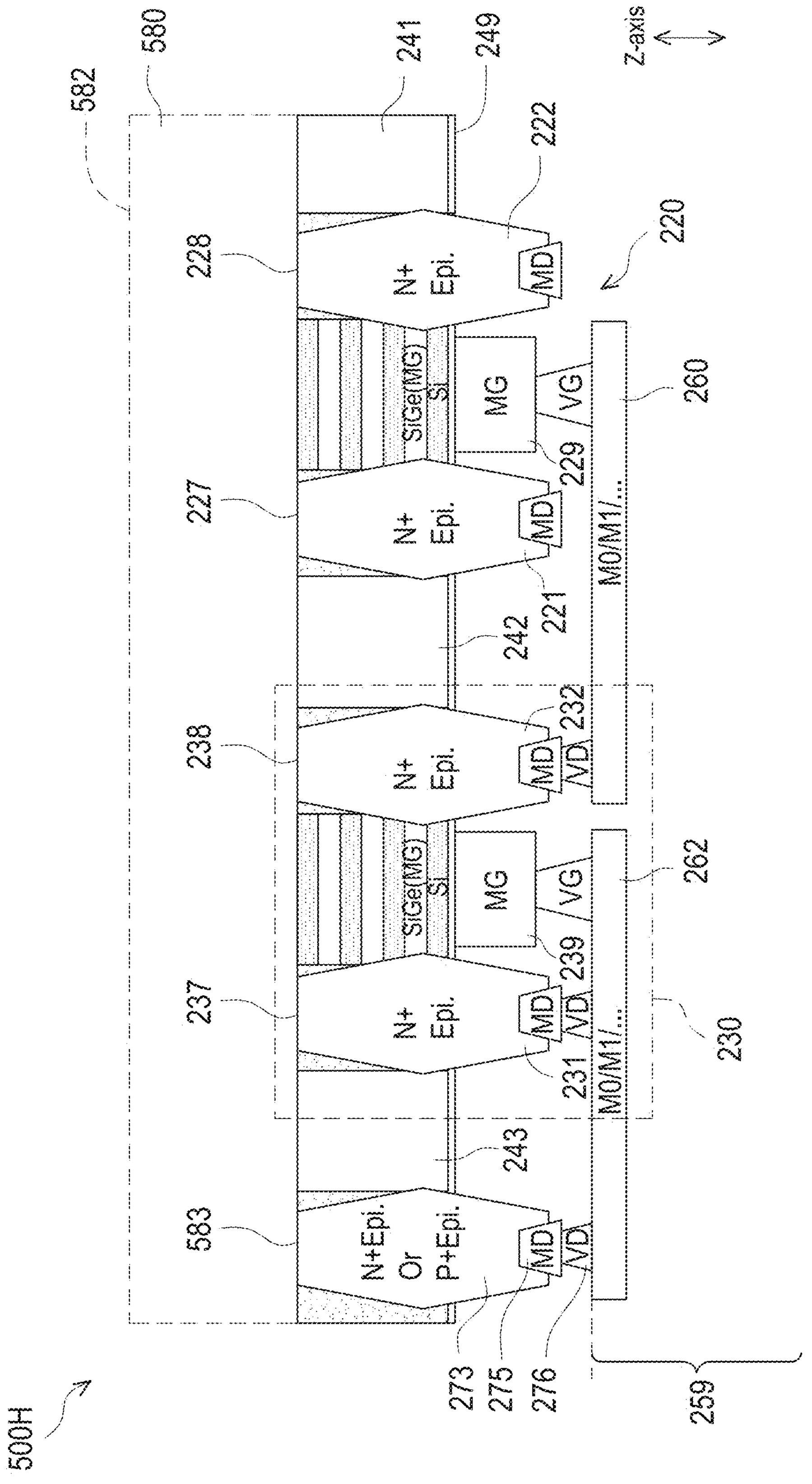

In FIG. 5H, the structure 500G is flipped upside down and temporarily bonded to a carrier (not shown). Wafer thinning is performed from the back side 582 to completely remove the semiconductor substrate 580, and expose the bottoms 227, 228, 237, 238, 583 of the source/drain features 221, 222, 231, 232. A resulting structure 500H is thus obtained.

In some embodiments, an insulation layer (not shown) corresponding to the insulation layer 210 is deposited over the exposed surface (i.e., the upper surface in FIG. 5H) of the structure 500H. As a result, a structure corresponding to the structure 500E before the formation of the FTV 274 is obtained. In at least one embodiment, further processes, e.g., as described with respect to FIGS. 5E-5F, are subsequently performed.

In at least one embodiment, an alternative process to that described with respect to FIG. 5H also includes flipping the structure 500G upside down and performing wafer thinning from the back side 582 of the semiconductor substrate 580. However, the semiconductor substrate 580 is not completely removed. Instead, a semiconductor layer, e.g., a portion of the semiconductor substrate 580, remains after the wafer thinning, and is converted, e.g., by an oxidation process, into an insulation layer corresponding to the insulation layer 210. In at least one embodiment, further processes, e.g., as described with respect to FIGS. 5E-5F, are subsequently performed.

In some embodiments, one or more advantages described herein are achievable by one or more IC devices manufactured by the processes described with respect to one or more of FIGS. 5A-5H. Although the described manufacturing processes include formation of nanosheet devices in one or more embodiments, other types of devices, e.g., nanowire, FinFET, planar, or the like, are within the scopes of various embodiments. In some embodiments, it is possible to provide antenna effect protection for bulk-less devices and/or in bulk-less processes. Examples of bulk-less processes include, but are not limited to, SOI processes, SPR processes, super bottom isolation (SBI) processes, or the like. In some embodiments, it is possible to provide cross-domain antenna effect protection across different power domains, as well as antenna effect protection in the same power domain.

Figure 6:
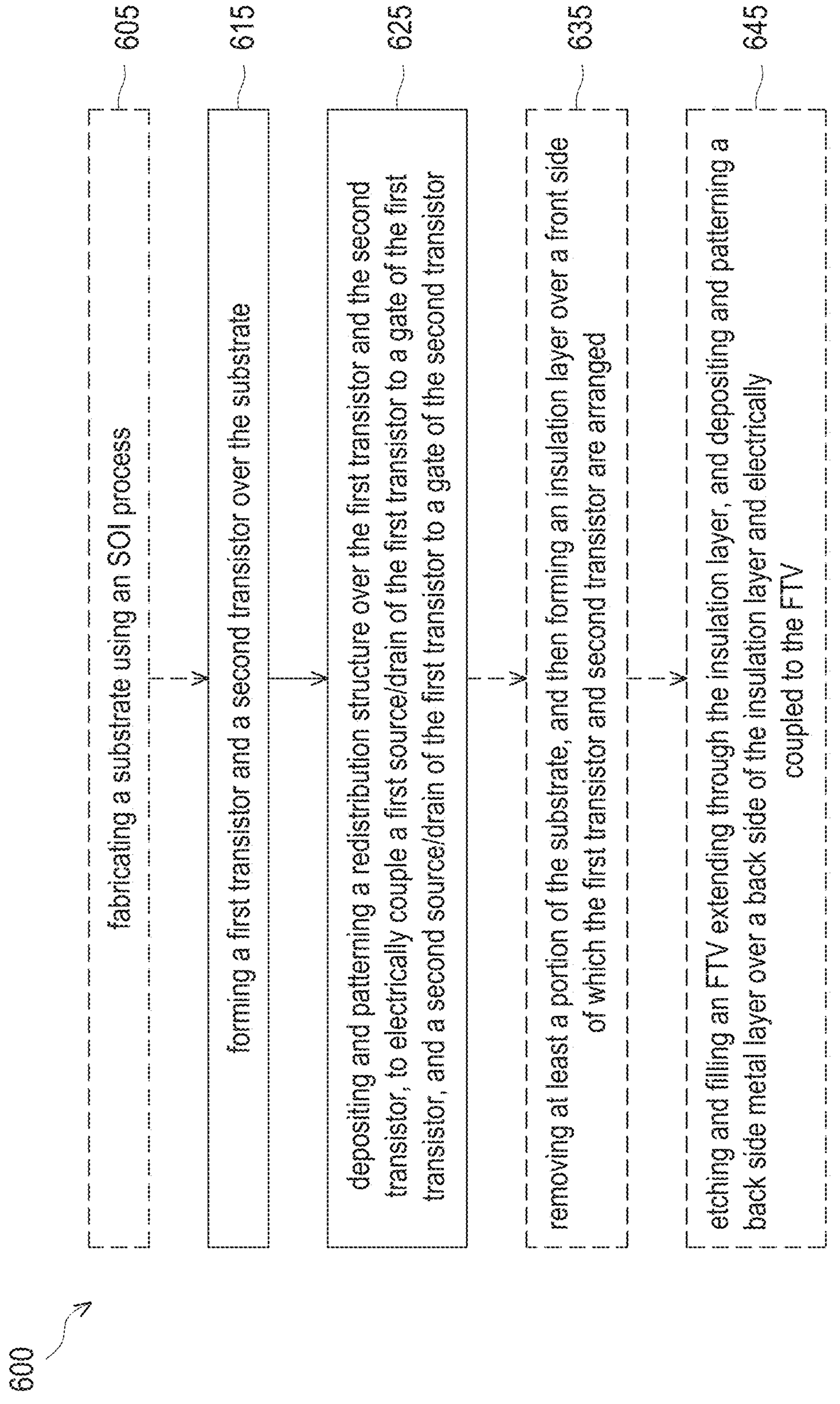
FIG. 6 is a flowchart of a method of manufacturing an IC device, in accordance with some embodiments.

FIG. 6 is a flowchart of a method 600 of manufacturing an IC device, in accordance with some embodiments. In some embodiments, the method 600 is usable to manufacture one or more IC devices as described with respect to one or more of FIGS. 2A-2E. 3A-3E.

At operation 605, a substrate is fabricated by a SOI process. For example, one or more SOI processes are used to fabricate a SOI substrate having at least a semiconductor substrate 570 and an insulation layer 210 thereon, as described with respect to FIG. 5A. In at least one embodiment, operation 605 is omitted.

At operation 615, a first transistor and a second transistor are formed over a substrate. In at least one embodiment, the substrate is a SOI substrate fabricated at operation 605, and the first transistor and second transistor are formed over a front side of the insulation layer included in the SOI substrate. In some embodiments, the substrate comprises a semiconductor substrate and the first transistor and second transistor are formed over a front side of the semiconductor substrate, for example, as described with respect to FIG. 5G. Example processes for forming the first transistor (e.g., antenna NMOS 230) and second transistor (e.g., to-be-protected device 220) are described with respect to FIGS. 5A-5B. The described example processes are for forming nanosheet transistors. Other transistor types, such as nanowire, FinFET, planar, or the like, are within the scopes of various embodiments.

At operation 625, a redistribution structure is formed over the first transistor and the second transistor, to electrically couple a first source/drain of the first transistor to a gate of the first transistor, and a second source/drain of the first transistor to a gate of the second transistor. For example, as described with respect to FIG. 5C, a redistribution structure 259 is formed by depositing and patterning various metal layers and via layers. The redistribution structure 259 comprises a conductor 262 electrically coupling a first source/drain 231 to a gate 239 of the first transistor, i.e., antenna NMOS 230, and a conductor 260 electrically coupling a second source/drain 232 of the first transistor, i.e., antenna NMOS 230, to a gate 229 of the second transistor, i.e., to-be-protected device 220. While one or more upper metal layers and/or via layers of the redistribution structure 259 are being fabricated, electric charges accumulated on the conductor 260 are discharged by the antenna NMOS 230 to the conductor 262, thereby protecting the gate dielectric of the conductor 260 from being damaged, as described herein.

At operation 635, when the substrate over which the first transistor and second transistor are formed in operation 615 is a semiconductor substrate, the semiconductor substrate is at least partially removed, and then an insulation layer is formed such that the first transistor and second transistor are arranged over a front side of the insulation layer. For example, as described with respect to FIG. 5H, wafer thinning is performed on a back side 582 of the semiconductor substrate 580 to completely remove the semiconductor substrate 580, and then an insulation layer corresponding to the insulation layer 210 is formed to have the first transistor (e.g., antenna NMOS 230) and second transistor (e.g., to-be-protected device 220) arranged on the front side of the insulation layer. For another example, the wafer thinning is performed to remove a portion, but not an entirety, of the semiconductor substrate 580, and a remaining semiconductor layer is converted into an insulation layer corresponding to the insulation layer 210. In at least one embodiment, operation 635 is omitted.

At operation 645, an FTV is formed, by etching and filling, to extend through the insulation layer, and a back side metal layer is deposited and patterned over a back side of the insulation layer to be electrically coupled to the FTV. For example, as described with respect to FIGS. 5E-5F, an FTV 274 is formed to extend through the insulation layer 210, and a back side metal layer, e.g., BM0, is deposited and patterned over a back side 212 of the insulation layer 210 to be electrically coupled to the FTV 274. As a result, it is possible in one or more embodiments to form a substrate tap or a well tap, and/or to provide a power supply voltage, e.g., VSS, from the back side to the front side to turn OFF a corresponding antenna effect protection device (e.g., antenna NMOS 230) during normal operation of the manufactured IC device. In at least one embodiment, one or more of the described processes in operation 645 is/are omitted. In at least one embodiment, one or more advantages described herein are achievable by IC devices manufactured in accordance with the method 600.

The described methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

In some embodiments, an integrated circuit (IC) device comprises an antenna effect protection device, and a to-be-protected device. A first source/drain of the antenna effect protection device is electrically coupled to a first conductor configured to carry a reference voltage. A second source/drain of the antenna effect protection device is electrically coupled by a second conductor to a gate of the to-be-protected device. The antenna effect protection device is a bulk-less device.

In some embodiments, an integrated circuit (IC) device comprises a first power domain, a second power domain, a first antenna effect protection device in the first power domain, and a second antenna effect protection device in the second power domain. A gate of the second antenna effect protection device is electrically coupled to a source/drain of the first antenna effect protection device.

In a method of manufacturing an integrated circuit (IC) device in accordance with some embodiments, a first transistor and a second transistor are formed over a substrate, and a redistribution structure is deposited and patterned over the first transistor and the second transistor. The redistribution structure electrically couples a first source/drain of the first transistor to a gate of the first transistor, and a second source/drain of the first transistor to a gate of the second transistor. The first transistor and second transistor are formed over a front side of an insulation layer of the substrate. Alternatively, the method further comprises removing at least a portion of the substrate, and then forming an insulation layer, wherein the first transistor and second transistor are arranged over a front side of the insulation layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) device, comprising:
an antenna effect protection device; and
a to-be-protected device,
wherein
a first source/drain of the antenna effect protection device is electrically coupled to a first conductor configured to carry a reference voltage,
a second source/drain of the antenna effect protection device is electrically coupled by a second conductor to a gate of the to-be-protected device, and
the antenna effect protection device is a bulk-less device, and is configured to:
in response to a reversed bias applied between the first source/drain and the second source/drain of the antenna effect protection device,
discharge electric charges of a first polarity on the second conductor to the first conductor through a leakage current of the antenna effect protection device.

2. The IC device of claim 1, wherein
a gate of the antenna effect protection device is electrically coupled to the first conductor.

3. The IC device of claim 1, further comprising:
a further antenna effect protection device,
wherein a gate of the antenna effect protection device is electrically coupled to a source/drain of the further antenna effect protection device.

4. The IC device of claim 1, wherein
the to-be-protected device is a bulk-less device.

5. The IC device of claim 1, further comprising:
an insulation layer having a front side and a back side opposite to the front side, wherein the to-be-protected device, the antenna effect protection device and the first conductor are over the front side of the insulation layer; and
a conductive structure extending through the insulation layer, and electrically coupling the first conductor on the front side to the back side of the insulation layer.

6. The IC device of claim 5, further comprising:
a semiconductor layer over the back side of the insulation layer, the semiconductor layer electrically coupled to the first conductor through the conductive structure.

7. The IC device of claim 5, further comprising:
a back side metal layer over the back side of the insulation layer, the back side metal layer electrically coupled to the first conductor through the conductive structure.

8. The IC device of claim 7, wherein
the back side metal layer comprises a back side power rail electrically coupled to the first conductor through the conductive structure.

9. The IC device of claim 5, wherein
the conductive structure comprises:
an epitaxy structure over the front side of the insulation layer, and electrically coupled to the first conductor, and
a feed through via extending through the insulation layer, and electrically coupling the epitaxy structure to the back side of the insulation layer.

10. The IC device of claim 9, wherein
the epitaxy structure comprises a substrate tap or a well tap located outside the antenna effect protection device and the to-be-protected device.

11. The IC device of claim 9, wherein
the epitaxy structure comprises the first source/drain of the antenna effect protection device.

12. The IC device of claim 1, wherein the antenna effect protection device is further configured to:
in response to a forward bias applied between the first source/drain and the second source/drain of the antenna effect protection device,
discharge electric charges of a second polarity on the second conductor to the first conductor through a channel current of the antenna effect protection device, the second polarity opposite to the first polarity.

13. An integrated circuit (IC) device, comprising:
a first power domain;
a second power domain;
a first antenna effect protection device in the first power domain;
a second antenna effect protection device in the second power domain, wherein a gate of the second antenna effect protection device is electrically coupled to a source/drain of the first antenna effect protection device; and
a first functional device in the second power domain,
wherein a gate of the first functional device is electrically coupled to a source/drain of the second antenna effect protection device.

14. The IC device of claim 13, further comprising:
a second functional device in the first power domain; and
a third antenna effect protection device in the first power domain,
wherein a gate of the second functional device is electrically coupled to a source/drain of the third antenna effect protection device.

15. The IC device of claim 13, wherein
each of the first antenna effect protection device, the second antenna effect protection device and the first functional device is a bulk-less device.

16. The IC device of claim 15, wherein
each of the first antenna effect protection device and the second antenna effect protection device is
a grounded-gate n-channel metal-oxide semiconductor (GGNMOS), or
a gate-VDD p-channel metal-oxide semiconductor (GDPMOS).

17. The IC device of claim 13, further comprising at least one of:
a first power clamp circuit in the first power domain;
a second power clamp circuit in the second power domain;
a first electrostatic discharge (ESD) circuit electrically coupled between a first local power rail of the first power domain and a global power rail;

a second ESD circuit electrically coupled between a second local power rail of the second power domain and the global power rail; or a third ESD circuit electrically coupled between the first local power rail and the second local power rail.

18. An integrated circuit (IC) device, comprising:

a first transistor and a second transistor over a front side of an insulation layer; and a redistribution structure over the first transistor and the second transistor, and electrically coupling a first source/drain of the first transistor to a gate of the second transistor, wherein at least one of a bottom of a first source/drain of the second transistor or a bottom of a second source/drain of the second transistor is over and in direct contact with the front side of the insulation layer, and wherein the IC device further comprises:

a conductive feed through via extending through the insulation layer, and electrically coupled to a second source/drain of the first transistor; and a semiconductor layer on a back side of the insulation layer, the semiconductor layer electrically coupled to the second source/drain of the first transistor through the feed through via.

19. The IC device of claim 18, wherein:

the feed through via is electrically coupled to the second source/drain of the first transistor and a gate of the first transistor.

20. The IC device of claim 18, wherein the redistribution structure comprises a conductor configured to carry a reference voltage, and electrically coupled to the second source/drain of the first transistor.

* * * * *